(12) United States Patent
Preindl

(10) Patent No.: US 12,301,140 B2
(45) Date of Patent: *May 13, 2025

(54) SYSTEM AND METHODS FOR HIGH PERFORMANCE FILTERING TECHNIQUES FOR SENSORLESS DIRECT POSITION AND SPEED ESTIMATION

(71) Applicant: The Trustees of Columbia University in the City of New York, New York, NY (US)

(72) Inventor: Matthias Preindl, New York, NY (US)

(73) Assignee: THE TRUSTEES OF COLUMBIA UNIVERSITY IN THE CITY OF NEW YORK, New York, NY (US)

( * ) Notice: Subject to any disclaimer, the term of this patent is extended or adjusted under 35 U.S.C. 154(b) by 68 days.

This patent is subject to a terminal disclaimer.

(21) Appl. No.: 18/137,874

(22) Filed: Apr. 21, 2023

(65) Prior Publication Data

US 2023/0387842 A1 Nov. 30, 2023

Related U.S. Application Data

(63) Continuation of application No. 17/484,313, filed on Sep. 24, 2021, now Pat. No. 11,671,042, which is a
(Continued)

(51) Int. Cl.
*H02P 21/13* (2006.01)
*H02P 21/18* (2016.01)
*H03H 21/00* (2006.01)

(52) U.S. Cl.
CPC ............. *H02P 21/13* (2013.01); *H02P 21/18* (2016.02); *H03H 21/0043* (2013.01); *H03H 2021/0061* (2013.01)

(58) Field of Classification Search
CPC ..... H02P 21/13; H02P 21/18; H03H 21/0043; H03H 21/0018; H03H 21/0014
See application file for complete search history.

(56) References Cited

U.S. PATENT DOCUMENTS 6,598,008 B2 7/2003 Lee
6,788,024 B2 9/2004 Kaneko et al.
(Continued)

FOREIGN PATENT DOCUMENTS

WO 2018193697 A1 10/2018

OTHER PUBLICATIONS

Agrawal et al., "Low speed sensorless control of PMSM drive using high frequency signal injection," 2015 Annual IEEE India Conference (INDICON), New Delhi, India, 2015, pp. 1-6, doi: 10.1109/INDICON.2015.7443383.
(Continued)

*Primary Examiner* — Said Bouziane
(74) *Attorney, Agent, or Firm* — Quarles & Brady, LLP

(57) ABSTRACT

Disclosed are implementations, including a method that includes obtaining measurement samples relating to electrical operation of an electric motor drive providing power to an electric motor, deriving, based on the samples, instantaneous estimates for parameters characterizing speed and/or position of the motor according to an optimization process based on a cost function defined for the samples, and applying a filtering operation to the instantaneous estimates to generate filtered values of the motor's speed and/or position. The filtering operation includes computing the filtered values using the derived instantaneous estimates in response to a determination that a computed convexity of the cost function is greater than or equal to a convexity threshold value, and/or applying a least-squares filtering operation to the derived instantaneous estimates and using at least one set
(Continued)

of previous estimates derived according to the optimization process applied to previous measurement samples.

14 Claims, 19 Drawing Sheets

Related U.S. Application Data continuation of application No. 16/697,630, filed on Nov. 27, 2019, now Pat. No. 11,159,112.

(60) Provisional application No. 62/926,913, filed on Oct. 28, 2019, provisional application No. 62/773,896, filed on Nov. 30, 2018.

(56) References Cited

U.S. PATENT DOCUMENTS

| | | | |
|---|---|---|---|
| 6,894,454 | B2 | 5/2005 | Patel et al. |
| 9,831,760 | B2 | 11/2017 | Ai-Hokayem et al. |
| 9,985,565 | B2 | 5/2018 | Royak et al. |
| 2009/0033259 | A1* | 2/2009 | Cesario .................. H02P 21/18 318/400.04 |
| 2016/0282392 | A1 | 9/2016 | Lee et al. |
| 2017/0155347 | A1 | 6/2017 | Park et al. |
| 2018/0287537 | A1 | 10/2018 | Hsiao et al. |

OTHER PUBLICATIONS

Andreescue et al., "Combined flux observer with signal injecton enhancement for wide speed range sensorless direct torque control of IPMSM drives," IEEE Transactions on Energy Conversion, vol. 23, No. 2, pp. 393-402, 2008.
Antonell et al., "Enhanced low-speed operations for sensorless anisotropic pm sysnchronous motor drives by a modified back-emf observer," IEEE Transactions on Industrial Electronics, vol. 65, No. 4, pp. 3069-3076, 2018.
Bianchi et al., "Comparison of pm motor structures and sensorless control techniques for zero-speed rotor position detection," IEEE Transactions on Power Electronics, vol. 22, No. 6, pp. 2466-2475, 2007.
Biehoff, "A general pll-type algorithm for speed sensorless control of electrical drives," IEEE Transactions on Industrial Electronics, vol. 64, No. 12, pp. 9253-9260, 2017.
Boldea et al., "Active flux concept for motion-sensorless unified AC drives," IEEE Transactions on Power Electronics, vol. 23, No. 5, pp. 2612-2618, 2008.
Bolognani et al., "Sensorless control of IPM motors in the low-speed range and at standstill by HF injection and DFT processing," IEEE Transactions on Industry Applications, vol. 47, No. 1, pp. 96-104, 2011.
Bolognani et al., "Sensorless full-digital PMSM drive with EKF estimation of speed and rotor position," IEEE Transactions on Industrial Electronics, vol. 46, No. 1, pp. 184-191, 1999.
Boussak, "Implementation and experimental investigation of sensorless speed control with initial rotor position estimation for interior permanent magnet synchrounous motor drive," IEEE Transactions on Power Electronics, vol. 20, No. 6, pp. 1413-1422, 2005.
Boyd et al., "Convex Optimization," Cambridge University Press, 2004.
Callegaro et al., "Optimation-based position sensorless control for induction machines," in IEEE Transportation Elictrification Conference and Expo (ITEC), 2018.
Chan et al., "Sensorless permanent-magnet synchronous motor drive using a reduced-order rotor flux observer," IET Electric Power Applications, vol. 2, pp. 88-98, 2008.
Chen et al., "An extended electromotive force model for sensorless control of interior permanent-magnet synchronous motors," IEEE Transactions on Industrial Electronics, vol. 50, No. 2, pp. 288-295, 2003.
Chi et al., "Sliding-mode sensorless conrol of direct-drive PM synchronous motors for washing machine applications," IEEE Transactions on Industry Applications, vol. 45, No. 2, pp. 582-590, 2009.
Choi et al., "Robust adaptive sensorless control for permanent-magnet synchronous motors," IEEE Transactions on Power Electronics, vol. 32, No. 5, pp. 3989-3997, 2017.
Depenbrock, "Direct self-control (DSC) of inverter-fed induction machine," IEEE Transactions on Power Electronics, vol. 3, No. 4, pp. 420-429, 1988.
Ferland, "Matrix-theoretic criteria for the quasiconvexity of twice continuously differentiable functions," Linear Algebra and its Applications, vol. 38, pp. 51-63, 1981.
Fletcher et al., "Function minimization by conjugate gradients," The Computer Journal, vol. 7, pp. 149-154, 1964.
Genduso et al., "Back EMF sensorless-control algorithm for high-dynamic performance PMSM," IEEE Transactions on Industrial Electronics, vol. 57, No. 6, pp. 2092-2100, 2010.
Geraee et al., "Position Sensorless and Adaptive Speed Design for Controlling Brushless DC Motor Drives," arXiv, 2018, pp. 1-6.
Gilbert, "Positive definite matrices and sylvester's criterion," The American Mathematical Monthly, vol. 98, No. 1, pp. 44-46, 1991.
Guglielmi et al., "Cross-saturation effects in IPM motors and related impact on sensorless control," IEEE Transactions on Industry Applications, vol. 42, No. 6, pp. 1516-1522, 2006.
Hannan et al., "Optimization techniques to enhance the performance of induction motor drives: A review, "Renewable and Sustainable Energy Reviews, vol. 81, part 2, 2018, pp. 1611-1626, ISSN. 1364-0321, https://doi.org/10.1016/j.rser.2017.05.240.
Ibarra-Rojas et al., "Global observability analysis of sensorless induction motors," Automatica, vol. 40, pp. 1079-1085, 2004.
Jeong et al., "Initial rotor position estimation of an interior permanent-magnet synchrounous machine using carrier-frequency injection methods," IEEE Transactions on Industry Applications, vol. 2, pp. 1218-1223, 2003.
Kim et al., "High performance IPMSM drives without rotational position sensors using reduced-order EKF," IEEE Transactions on Energy Conversion, vol. 14, No. 4, pp. 868-873, 1999.
Kim et al., "PWM switching frequency signal injection sensorless method in IPMSM," IEEE Transactions on Industry on Applications, vol. 48, No. 5, pp. 1576-1587, 2012.
Leidhold, "Position sensorless control of pm synchronous motors based on zeor-sequence carrier injection," IEEE Transactions on Industrial Electronics, vol. 58, No. 12, pp. 5371-5379, 2011.
Li et al., "A novel sensorless control method of ipmsm using dual pll structure," in International Power Electronics and Motion Control Conference, pp. 1216-1220, 2012.
Machida et al., "A motor speed control system using a hybrid of dual-loop pll and feed-forward," in IEEE International Workshop on Advanced Motion Control (AMC), pp. 185-190, 2010.
Mchida et al., "A motor speed control system using dual-loop PLL and speed feed-forward/back," 2010 IEEE International Conference on Mechatronics and Automation, 2010, pp. 1512-1517.
Montanari et al., "Speed sensorless control of induction motors based on a reduced-order adaptive observer," IEEE Transactions on Control Systems Technology, vol. 15, No. 6, pp. 1049-1064, 2007.
Morimoto et al., Sensorless control strategy for salient-pole PMSM based on extended EMF in rotating reference frame, IEEE Transactions on Industry Applications, vol. 38, pp. 1054-1061, 2001.
Muzikova et al., "Finite control set MPC with high frequency injections for sensorless position and speed estimation of a PMSM," in 2015 IEEE International Symposium on Predictive Control of Electrical Drives and Power Electronics (PRECEDE), IEEEE, 2015.
Nahid-Mobarakeh et al., "Back EMF estimation-based sensorless control of PMSM: Robustness with respect to measurement errors and inverter irregularities," IEEE Transactions on Industry Applications, pp. 1858-1865, 2004.
Nahid-Mobarakeh et al., "Mechanical sensorless control of PMSM with online estimation of stator resistance," IEEE Transactions of Industry Applications, vol. 40, No. 2, 457-471, 2004.
Nalakath et al., "Modeling and analysis of core loss of an IPM machine for online estimation purposes," in Annual Conferenceof the IEEE Industrial Electronics Society (IECON), 2015.

(56) References Cited

OTHER PUBLICATIONS

Nalakath et al., "Optimization-Based Poisition Sensorless Finite Control Set Model Predictive Control for ipmsms," in IEEE Transactions on Power Electronics, vol. 33, No. 10, pp. 8672-8682, Oct. 2018, doi: 10.1109/tpel.2017.2784816.

Ofori et al., "A Pulse-Injection-Based Sensorless Position Estimation Method for a Switched Reluctance Machine Over a Wide Speed Range," in IEEE Transactions on Industry Applications, vol. 51, No. 5, pp. 3867-3876, Sep.-Oct. 2015, doi: 10.1109/TIA.2015.2420618.

Pal et al., "Sensorless Speed Control of Induction Motor Driven Electric Vehicle Using Model Reference Adaptive Controller," Energy Procedia, vol. 90, 2016, pp. 5540-5551, ISSN: 1876-6102, https://doi.org/10.1016/j.egypro.2016.11.222.

Preindl et al.," Model predictive direct torque control with finite control set for PMSM drive systems, part 1: Maximum torque per ampere operation," IEEE Transactions on Industrial Informatics, vol. 9, No., 4, pp. 1912-1921, 2013.

Preindl et al., "Sensorless model predictive direct current control using novel second-order PLL observer for PMSM drive systems," IEEE Transactions on Industrial Electronics, vol. 58, No. 9, pp. 4087-4095, 2011.

Preindle et al., "Optimal state reference computation with constrained MTPA criterion for PM motor drives," IEEE Transactions on Power Electronics, vol. 30, No. 8, 4524-4535, 2015.

Preindle, "Robust Control Invariant Sets and Lyapunov-Based MPC for IPM Synchronous Motor Drives," IEEE Transactions on Power Electronics, vol. 63, No. 6, pp. 3925-3933, 2016.

Raca et al., "Carrier-signal selection for sensorless control of pm synchronous machines at zero and very low speeds," IEEE Transactions on Industry Applications, vol. 46, No. 1, pp. 167-178, 2010.

Rovere et al., "Sensorless finite-control set model predictive control for ipmsm drives," IEEE Transactions on Industrial Electronics, vol. 63, No. 9, pp. 5921-5931, 2016.

Shinnaka, "New sensorless vector control using minimun-order flux state observer in a stationary reference frame for permanent-magnet synchronous motors," IEEE Transactions on Industrial Electronics, vol. 53, No. 2, pp. 388-398, 2006.

Shruthi et al., "Sensorless Control Algorithm for High Dynamic Performance PMSM" The International Journal of Engineering and Science (IJES), vol. 3, No. 6, 2014, pp. 68-72.

Sun et al., "Global convergence of conjuate gradient methods without line search," Annals of Operations Research, vol. 103, pp. 161-173, 2001.

Sun et al., "Unified Wide-Speed Sensorless Scheme using Nonlinear Optimization for IPMSM Drives, "IEEE Transactions on Power Electronics, vol. 32, No. 8, pp. 6308-6322, 2017.

Takahashi et al., "A new quick-response and high-efficiency control strategy of an induction motor," IEEE Trans. Ind. Appl., vol. IA-22, No. 5, pp. 820-827, 1986.

Tilli et al., "Semiglobal uniform asymptotic stability of an easy-to-implement pll-like sensorless observer for induction motors," IEEE Transactions on Automatic Control, vol. 61, pp. 3612-3618, 2016.

Toliyat et al., "A review of RFO induction motor parameter estimation techniques," in IEEE Transactions on Energy Conversion, vol. 18, No. 2, pp. 271-283, 2003.

Wang et al., "DSP-based control of sensorless IPMSM drives for wide-speed-range operation," IEEE Transactions on Industrial Electronics, vol. 60, No. 2, pp. 720-727, 2013.

Wang et al., "Quadrature PLL-based high-order sliding mode observer for IPMSM sensorless control with online MTPA control strategy," IEEE Transactions on Energy Conversion, vol. 28, No. 1, pp. 214-224, 2013.

Yang et al., "Analysis of iron and magnet losses in surface-permanent-magnet machines resulting from injection-based self-sensign position estimation," IEEE Transactions on Industry Applications, vol. 48, No. 6, pp. 1901-1910, 2012.

Yang et al., "Thermal management of electric mahcines," IET Electrical Systems in Transportation, vol. 7, No. 2, pp. 104-116, 2016.

Yong et al., "Optimation-based position estimation of pm synchronous machine motor drives with magnetic saturation," in IEEE International Symposium on Sensorless Control for Electrical Devices (SLED), 2018.

Zbede, et al., "Model Predictive MRAS Estimator for Sensorless Induction Motor Drives," in IEEE Transactions on Industrial Elections, vol. 63, No. 6, pp. 3511-3521, Jun. 2016, doi: 10.1109/TIE.2016.2521721.

Zhang et al., "Adaline-network-based pll for position sensorless interior permanent magnet synchronous motor drives," IEEE Transactions on Power Electronics, vol. 31, No. 2, pp. 1450-1460, 2016.

\* cited by examiner

Selective filtering

Selective and FIR filter

Selective and dual PLL

FIR Filter

SYSTEM AND METHODS FOR HIGH PERFORMANCE FILTERING TECHNIQUES FOR SENSORLESS DIRECT POSITION AND SPEED ESTIMATION

CROSS-REFERENCE TO RELATED APPLICATIONS

This application is the continuation of U.S. application Ser. No. 17/484,313, filed on Sep. 24, 2021, which is a continuation of U.S. application Ser. No. 16/697,630 filed on Nov. 27, 2019, now U.S. Pat. No. 11,159,112, which claims priority to, and the benefit of, U.S. Provisional Application Nos. 62/773,896 entitled "Systems and Methods for Improved Convergence And Robustness Properties of Optimization-Based Position and Speed Estimation" and filed Nov. 30, 2018, and 62/926,913 entitled "Systems and Methods For High Performance Selective and Output Filter Techniques For Sensorless Direct Position And Speed Estimation" and filed Oct. 28, 2019, the contents of which are incorporated herein by reference in their entireties.

BACKGROUND

Synchronous motor drives require an accurate rotor position and speed information for high performance control. Position sensorless estimation schemes have been introduced to remove the cost of a resolver or encoder and improve their reliability by removing a single point of failure. Use of position/speed sensorless estimation is especially compelling in mass-produced drive systems (e.g. in hybrid and electric vehicles), when the machine is physically distant from the motor controller (e.g. pumps for underground mining or wind power plants with converter at the tower base), when the available space for a motor drive is restricted (e.g. low power drives), when the drive system operates in hazardous or clean environments, when physical contact between stator and rotor is undesired, or in other circumstances. Currently, obtaining estimate convergence and/or robustness guarantees is difficult to achieve due to the nonlinearity of the problem statement.

SUMMARY

Disclosed are systems, methods, and other implementations for high performance filter techniques for direct position and speed estimation for an electric motor drive to augment its robustness against disturbances. The direct estimation concept provides an independent position and speed estimate at each sampling instant by solving an optimization problem parameterized with the current, current derivative, and/or the voltage signal for the system. Once the estimates are derived by the optimization process, one or more filters are applied to the estimates, including a selective filter to accept or discard the estimates based on criteria that assess the robustness of the estimates, a filter applied to the instantaneous estimates and previous estimates based, for example, on a least squares approach, and/or a dual PLL filtering implementation, as well as other filtering approaches. The approaches described herein can operate at any speed, and can employ a voltage injection approach at low speed, or PWM current derivative. Robustness of the solutions for the estimates can be further improved using appropriately configured perturbation signals.

The present discusses four example techniques, namely technique A (selective filtering), technique B (FIR filtering), technique C (dual PLL), and technique D (high-frequency perturbation method also called high-frequency injection), that can be combined in various ways and configurations to improve speed and position estimation for an electric motor. Additional filtering techniques, stages, and approaches, other than the four examples of techniques A-D, can also be incorporated into implementations of the systems and methods described herein. In some embodiments, the example techniques may apply to different stages of the estimation process. For example:

Technique A may be part of a first stage in which estimates are derived by solving a cost function;

Techniques B and C may be part of a second stage (also referred to as an "output filtering" stage, which is configured to improve estimates taking past estimates into account);

Technique C is based on a novel application of a phase-locked loop (PLL) approach to estimates derived based on solving optimization problems (e.g., optimization problems defined using cost functions); and Technique D relates a novel way to generate and inject a perturbation signal to facilitate derivation of good estimates.

In some embodiments, implementations of the systems described herein may include, for example, optional use of technique A, optionally in conjunction with Technique B or Technique C (alternatively, both techniques B and C may be used in tandem, with or without technique A). Technique D (or some variation thereof) can optionally be used independently of use of any of techniques A, B, and or C.

In some variations, a method is provided that includes obtaining one or more measurement samples relating to electrical operation of an electric motor drive providing power to an electric motor, deriving based on the one or more measurement samples instantaneous estimates for parameters characterizing one or more of a speed and a position of the electric motor according to an optimization process that is based on a cost function defined for the one or more measurement samples, and applying a filtering operation to the derived instantaneous estimates to generate refined filtered values of the speed and position for the electric motor. Applying the filtering operation may include one or more of, for example, computing the filtered values of the speed and position for the electric motor using the derived instantaneous estimates in response to a determination that a computed convexity of the cost function around the derived instantaneous estimates is greater than or equal to a convexity threshold value, and/or applying a least-squares filtering operation, yielding the filtered values for the speed and position of the electric motor, according to the derived instantaneous estimates and using at least one set of previous estimates derived according to the optimization process applied to previous one or more measurement samples.

Embodiments of the method may include at least some of the features described in the present disclosure, including one or more of the following features.

The method may further include computing the filtered values of the speed and position for the electric motor using previous instantaneous estimates, derived based on previous one or more measurement samples for the electric motor drive, without using the presently derived instantaneous values, when the convexity of the cost function around the derived instantaneous estimates is below the convexity threshold value.

Applying the filtering operation to the derived instantaneous estimates may include determining the filtered values for the speed and position values for the electric motor according to independent phase locked loop units applied to estimates of the speed and position determined according to the optimization process based on the cost function defined for the one or more measurement samples.

Applying the least-squares filtering operation may include applying the least-squares filtering operation with a finite impulse response filter.

The method may further include applying a perturbation input signal to the electric motor drive.

The perturbation input signal may have a magnitude that decreases as rotational speed of the electric motor drive increases.

The perturbation signal may include periodical portions of rising and falling sections approximating linear segments with slopes exceeding respective minimum slope thresholds required to increase robustness of a solution of the cost function for the one or more measurement samples, to reduce variation of the solution for the cost function as a result of noise in the one or more measurement samples. The periodical signal may include a triangular periodical signal with rising and falling slopes exceeding the respective minimum required slope thresholds.

Obtaining the one or more measurement samples may include obtaining one or more of, for example, controlled current provided to the electric motor by the motor drive, a derivative of the controlled current, and/or a control signal provided as input to the electric motor drive.

In some variations, a system is provided that includes an electric motor, an electric motor drive electrically coupled to the electric motor and providing power to the electric motor, at least one of a current sensor or a voltage sensor to obtain one or more measurement samples relating to electrical operation of the electric motor drive, and a controller. The controller is configured to derive based on the one or more measurement samples instantaneous estimates for parameters characterizing one or more of a speed and a position of the electric motor according to an optimization process that is based on a cost function defined for the one or more measurement samples, and apply a filtering operation to the derived instantaneous estimates to generate refined filtered values of the speed and position for the electric motor. The controller configured to apply the filtering operation is configured to perform one or more of, for example, compute the filtered values of the speed and position for the electric motor using the derived instantaneous estimates in response to a determination that a computed convexity of the cost function around the derived instantaneous estimates is greater than or equal to a convexity threshold value, and/or apply a least-squares filtering operation, yielding the filtered values for the speed and position of the electric motor drive, according to the derived instantaneous estimates and using at least one set of previous estimates derived according to the optimization process applied to previous one or more measurement samples.

Embodiments of the system may include at least some of the features described in the present disclosure, including at least some of the features described above in relation to the method, as well as one or more of the following features.

The controller configured to apply the filtering operation may be configured to compute the filtered values of the speed and position for the electric motor using previous instantaneous estimates, derived based on previous one or more measurement samples for the electric motor drive, without using the presently derived instantaneous values, when the convexity of the cost function around the derived instantaneous estimates is below the convexity threshold value.

The controller configured to apply the filtering operation to the derived instantaneous estimates may be configured to determine the filtered values for the speed and position values for the electric motor according to independent phase locked loop units applied to estimates of the speed and position determined according to the optimization process based on the cost function defined for the one or more measurement samples.

The controller configured to apply the least-squares filtering operation may be configured to apply the least-squares filtering operation with a finite impulse response filter.

The controller may further be configured to apply a perturbation input signal to the electric motor drive.

The at least one of the current sensor or the voltage sensor configured to obtain the one or more measurement samples may be configured to obtain one or more of, for example, controlled current provided to the electric motor by the motor drive, a derivative of the controlled current, or a control signal provided as input to the electric motor drive.

In some variations, a non-transitory computer readable media is provided, that includes instructions executable on a processor-based device to obtain one or more measurement samples relating to electrical operation of an electric motor drive providing power to an electric motor, derive based on the one or more measurement samples instantaneous estimates for parameters characterizing one or more of a speed and a position of the electric motor according to an optimization process that is based on a cost function defined for the one or more measurement samples, and apply a filtering operation to the derived instantaneous estimates to generate refined filtered values of the speed and position for the electric motor. The instructions to apply the filtering operation include one or more instructions to perform one or more of, for example, compute the filtered values of the speed and position for the electric motor using the derived instantaneous estimates in response to a determination that a computed convexity of the cost function around the derived instantaneous estimates is greater than or equal to a convexity threshold value, and/or apply a least-squares filtering operation, yielding the filtered values for the speed and position of the electric motor drive, according to the derived instantaneous estimates and using at least one set of previous estimates derived according to the optimization process applied to previous one or more measurement samples.

Embodiments of the computer readable media is may include at least some of the features described in the present disclosure, including at least some of the features described above in relation to the method, and the system.

In some variations, an additional method is provided that includes obtaining one or more measurement samples relating to electrical operation of an electric motor drive providing power to an electric motor, deriving based on the one or more measurement samples instantaneous estimates for parameters characterizing one or more of a speed and a position of the electric motor according to an optimization process that is based on a cost function defined for the one or more measurement samples, and selecting as output values of the optimization process one of: i) the derived instantaneous estimates in response to a determination that a computed convexity of the cost function around the derived instantaneous estimates is greater than or equal to a convexity threshold value, or ii) previous instantaneous estimates, derived based on previous one or more measurement samples for the electric motor drive, without using the presently derived instantaneous values, when the convexity of the cost function around the derived instantaneous estimates is below the convexity threshold value. The additional method further includes computing filtered values for the speed and position of the electric motor using the selected output values of the optimization process.

Embodiments of the additional method may include at least some of the features described in the present disclosure, including at least some of the features described above in relation to the first method, the system, and the computer readable media, as well as one or more of the following features.

The method may further include applying a least-squares filtering operation to the output values of the optimization process, yielding the filtered values for the speed and position of the electric motor, according to the derived instantaneous estimates and using at least one set of previous estimates derived according to the optimization process applied to previous one or more measurement samples.

The method may further include determining the filtered values for the speed and position values for the electric motor according to independent phase locked loop units applied to estimates of the speed and position determined according to the optimization process.

The method may further include applying a perturbation input signal to the electric motor drive.

Other features and advantages of the invention are apparent from the following description, and from the claims.

BRIEF DESCRIPTION OF THE DRAWINGS

These and other aspects will now be described in detail with reference to the following drawings.

Like reference symbols in the various drawings indicate like elements.

DESCRIPTION

Figure 1:
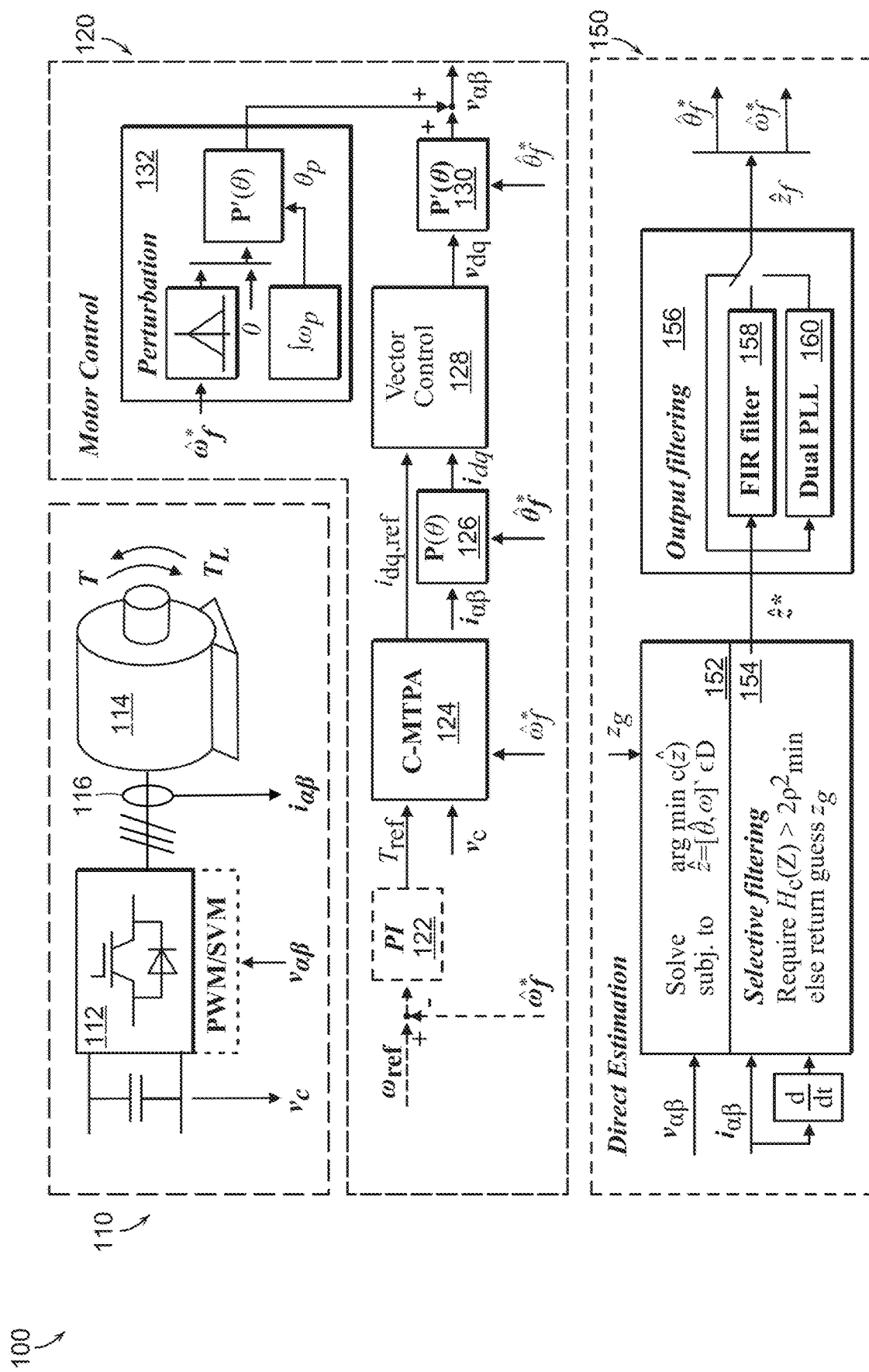
FIG. 1 is a schematic diagram of a sensorless electric motor-based system.

Described herein are methods, systems, devices, circuits, and other implementation to determine accurate and robust estimates of speed and position for a sensorless electric motor system to control the motor drive coupled to the motor (the motor drive generates the AC currents supplied to the motor to cause the required motion). To improve robustness of the estimates, various filtering operations, and other approaches (e.g., injection of a carefully generated perturbation signal satisfying certain criteria to improve robustness of the derived estimates) are performed to generate or process estimates derived via an optimization process applied to present samples. For example, to achieve high performance operation, a selective filter concept is proposed that discards samples lacking robustness based on cost function properties. The concept is most effective in removing worst case errors (which can be reduced by a factor of approximately 4). Additional output filtering techniques may be used with or without the selective filter approach to improve the estimates. For example, output filters can store past samples, such past samples may be used in the filtering operation(s). Furthermore, because direct estimation issues an independent position and speed estimate, both position and speed estimates may be used for filtering.

In some embodiments, a finite impulse response (FIR) structure is proposed that filters estimates according to a least-square criterion and is effective in reducing average estimation errors. For example, an FIR filter may be implemented that fits the past N samples (or the estimates derived from those samples) according to a least-squares criterion or some other criteria. Testing and experimentation showed that this approach can decrease the estimation noise with no compromise in terms of dynamics up to N=5, and a limited decrease of dynamics at higher N. At the test bench implemented to test the approaches described herein, the practical bandwidth was found to be 6.8 kHz for $N \in [0, 5]$, 4.3 kHz for $N \in [6, 8]$, and 2.3 kHz for $N \in [9, 12]$. Additionally or alternatively, a dual-PLL output filter is proposed and evaluated. The concept achieves a 1 kHz bandwidth compared to about 50 Hz of a conventional PLL and acts as a benchmark reference for the FIR filter approach. Hence, direct estimation with FIR or dual-PLL output filters can achieve a 10 to 100 times higher bandwidth than a conventional PLL at the same absolute mean error (<1%). Furthermore, the FIR implementation has 5 times the bandwidth of the dual-PLL at a similar noise.

As will be discussed in greater detail below, performance improvements (in terms of accuracy and robustness) for the position and rotational speed estimates can further be achieved by injecting a perturbation signal (particularly at relatively low rotational speeds) into the sensorless motor drive, with the perturbation signal having properties (as will become apparent below) that improve the robustness of the estimates. Examples of perturbation signal properties that are effective in improving estimate robustness include the use of periodic signals that have, at least during some portions of their periods, linear slope segments that exceed some pre-determined slope threshold. An example of such a periodic signal that was determined to be effective is a triangular perturbation signal.

Accordingly, in some embodiments, a method is provided that includes obtaining one or more measurement samples relating to electrical operation of an electric motor drive providing power to the electric motor, deriving based on the one or more measurement samples instantaneous estimates for parameters characterizing one or more of a speed and a position of the electric motor drive according to an optimization process that is based on a cost function defined for the one or more measurement samples, and applying a filtering operation to the derived instantaneous estimates to refine outputted values of the speed and position for the electric motor. Applying the filtering operation includes one or more of, for example, computing the filtered values of the speed and position for the electric motor using the derived instantaneous estimates in response to a determination that a computed convexity of the cost function around the derived instantaneous estimates is greater than or equal to a convexity threshold value, and/or applying a least-squares filtering operation, yielding the filtered values for the speed and position of the electric motor, according to the derived instantaneous estimates and using at least one set of previous estimates derived according to the optimization process applied to previous one or more measurement samples.

In some examples, the method may further include computing the filtered values of the speed and position for the electric motor using estimates, derived based on previous one or more measurement samples for the electric motor drive without using the presently derived instantaneous values, when the convexity of the cost function around the derived instantaneous estimates is below the convexity threshold value. In some embodiments, applying the filtering operation to the derived instantaneous estimates may include determining the filtered values for the speed and position values for the electric motor according to independent phase locked loop units applied to estimates of the speed and position determined according to the optimization process based on the cost function defined for the one or more measurement samples.

In some implementations, the method may further include applying a perturbation input signal to the electric motor drive. The perturbation input signal may have a magnitude that decreases as rotational speed of the electric motor drive increases. In some situations, the perturbation signal may include periodical portions of rising and falling sections approximating linear segments with slopes exceeding respective minimum slope thresholds required to increase robustness of a solution of the cost function for the one or more measurement samples to reduce variation of the solution for the cost function as a result of noise in the one or more measurement samples. In some examples, the periodical signal comprises a triangular periodical signal with rising and falling slopes exceeding the respective minimum required slope thresholds. Obtaining the one or more measurement samples may include obtaining one or more of, for example, an output current of the electric motor drive, and/or an output voltage of the electric motor drive.

In some variations, a system is provided that includes an electric motor, an electric motor drive electrically coupled to the electric motor and providing power to the electric motor, at least one of a current sensor or a voltage sensor to obtain one or more measurement samples relating to electrical operation of the electric motor drive, and a controller (e.g., a processor-based controller). The controller is configured to derive based on the one or more measurement samples instantaneous estimates for parameters characterizing one or more of a speed and a position of the electric motor according to an optimization process that is based on a cost function defined for the one or more measurement samples, and apply a filtering operation to the derived instantaneous estimates to generate refined filtered values of the speed and position for the electric motor. The controller configured to apply the filtering operation is configured to perform one or more of, for example, compute the filtered values of the speed and position for the electric motor using the derived instantaneous estimates in response to a determination that a computed convexity of the cost function around the derived instantaneous estimates is greater than or equal to a convexity threshold value, and/or apply a least-squares filtering operation, yielding the filtered values for the speed and position of the electric motor drive, according to the derived instantaneous estimates and using at least one set of previous estimates derived according to the optimization process applied to previous one or more measurement samples.

Thus, with reference to FIG. 1, a schematic diagram of a sensorless electric-motor based system 100, implemented with a controller (also referred to as "driver" or "drive") that controls the electric motor based on position and speed estimation according to the approaches described herein, is shown. Briefly, the system 100 includes a motor assembly 110 comprising a motor 114 with a stator (e.g., realized using magnets or having stator windings), and a rotor (e.g., realized using one or more permanent magnets). Upon controlled application of currents through the stator windings, a magnetic field is generated inside the stator that interacts with the magnetic field of the permanent magnets and results in the generation of torque applied to the rotor, thus causing the rotor to rotate. As further shown in FIG. 1, a pulse width modulation (PWM) controller 112 (also referred to as a motor drive) is electrically coupled to the motor 114, and is configured to controllably actuate/energize (i.e., drive) the motor 114 with controllably varying currents, thus causing the rotor to rotate (e.g., at a predetermined rotational velocity). The drive may be connected to an AC power source or a DC power source, and is configured to generate (from AC or DC power) AC current that actuate the motor 114 to generate the required motion. In some embodiments, the drive 112 may be implemented according to a space vector modulation (SVM) process to thus generate (e.g., from a DC source) the waveforms that are applied to the motor 114. Generation of the current waveforms applied to the motor 114 may be based on other processes.

Operation of a speed-controlled motor drive will next be described. Operation of the drive 112 is based on an input signal, $V_{\alpha\beta}$, that is derived by a motor control circuitry 120 (which in the schematic diagram of FIG. 1 is shown as a separate circuit, but may be implemented on the same device on which the drive 112 is implemented). A description of the operations, procedures, and computations implemented by the motor control circuitry 120 will be discussed in greater detail below. Briefly, the signal $V_{\alpha\beta}$, outputted by the motor control circuitry 120 (and inputted to the drive 112 of the motor assembly 110) is derived based on the current applied to the motor 114 (i.e., from the output of the PWM/SVM controller 112) provided to an orthogonal Park transformation unit 126 (marked $P(\theta)$). The Park transformation unit 126 also receives as input an estimated value of the rotational position, $\hat{\theta}_f^*$, of the rotor of the motor 114, and generates an output $i_{dq}$ provided to the vector control unit 128. The vector control unit 128 also receives as input a reference current signal $i_{dq,ref}$ (generated by a constrained maximum torque per ampere (C-MTPA) unit 124, which is configured to determine the needed or desired d and q axes currents (e.g., by maintaining the current for one axis at 0, while computing the current value for the other axis that needed to established a desired torque), and outputs the signal $v_{dq}$, which is inputted to an inverse Park transformation unit 130 (marked as P'(θ)), together with the estimated value of the rotational position, $\hat{\theta}_f^*$, to determine the signal $V_{\alpha\beta}$ provided to the drive 112 of the motor assembly 110. As further illustrated in FIG. 1, to generate the reference current signal $i_{dq,ref}$, the C-MTPA unit receives as input an estimated values of the rotational speed, $\bar{\omega}_f^*$ of the rotor of the motor 114, and the values $T_{ref}$ and $V_c$ (i.e., the DC voltage level used by the motor assembly). The signal $T_{ref}$ is derived by a proportional integral (PI) controller 122 based on a rotational speed reference value, $\omega_{ref}$, and the estimated rotational speed of the rotor $\bar{\omega}_f^*$. In some embodiments, and as will be discussed in greater detail below, the motor control circuitry 120 may further include a rotating high-frequency voltage perturbation source 132, configured to add a perturbation voltage signal at low speeds. The perturbation magnitude is linearly scaled to zero as the speed magnitude increases. Thus, the perturbation input signal has a controllably varying magnitude that decreases as rotational speed of the electric motor increases. In some embodiments, the perturbation signal includes periodical portions of rising and falling sections approximating linear segments with slopes exceeding respective minimum slope thresholds required to increase robustness of a solution of the cost function for the one or more measurement samples in order to reduce variation of the solution for the cost function as a result of noise in the one or more measurement samples. For example, the periodical signal may include a triangular periodical signal with rising and falling slopes exceeding the respective minimum required slope thresholds. It is to be noted that, in some embodiments, motors can also be torque controlled, e.g., where external torque references fed directly to the motor and no local PI controller exists (e.g., as in electric vehicle traction motors). In such cases (and the implementations described above), the C-MTPA unit 124 may be configured to transform a torque reference into current references. Other implementations and configurations to achieve controlled operation of motor drives may be realized in some of the embodiments described herein.

Thus, the signal Vαβ, based on which the actuating AC currents driving the motor 114 are generated, requires reliable estimates of the instantaneous rotational speed and position of the rotor of the motor 114. In the embodiments described herein, the rotational speed $\bar{\omega}_f^*$ and the rotational position $\hat{\theta}_f^*$ are derived according to an optimization process realized according to a direct estimation circuit/unit 150 in FIG. 1. The direct estimation circuit 150 is configured to derive, by an optimization unit 152, instantaneous estimates, based on the one or more measurement samples (e.g., the sensed current, $i_{\alpha\beta}$, the derivative of the sensed current, as well as, in some embodiments, the voltage signal $V_{\alpha\beta}$ generated by the motor control circuitry 120), for parameters characterizing one or more of a speed and a position of the electric motor according to an optimization process that is based on a cost function defined for the one or more measurement samples. The optimization process yields the instantaneous values, $\hat{\theta}$ and $\hat{\omega}$ ω, representative of optimized position and rotational speed estimates for the rotor of the motor 114.

As further illustrated in FIG. 1, the direct estimation circuit 150 also includes a filtering circuitry that is applied to the derived estimates to refine output values (of the direct estimation circuit 150) of the speed and position for the motor 114, e.g., in order to improve the robustness of the speed and position estimates, thus improving robustness of the signal $V_{\alpha\beta}$ applied to the drive 112. Specifically, the direct estimate circuit 150 includes a selective filter 154 configured to determine whether to use or discard the present estimates derived using the optimization process. The filtering unit 154 may thus use the speed and position estimates derived by the optimization unit 152 in response to a determination that a computed convexity of the cost function around the derived instantaneous estimates is greater than or equal to a convexity threshold value. On the other hand, when the convexity of the cost function around the derived instantaneous estimates is below the convexity threshold value, the speed and rotational values used for further processing (e.g., to derive subsequent values of the control signal $V_{\alpha\beta}$) may be those of previously derived estimates derived based on previous one or more measurement samples for the electric motor drive 112 (in other words, the estimates just derived through the optimization process of the unit 152 are discarded, and in their place, previous estimates are used).

The position and speed values selected by the selective filter 154 may be provided directly to the motor control circuitry 120, or, in some embodiments (and as also depicted in FIG. 1), may be processed with further filtering performed by a downstream output filter 156. Since direct estimation issues an independent position and speed estimates at each time instant, output filter strategies can be applied that reduce noise by linking an estimate to past N estimates. For example, a finite impulse response (FIR) filter can be used to solve, for example, a least-squares problem. First, the filter fits the position and speed estimate to the equation $\dot{\theta}=\omega$ (which is not guaranteed by direct estimation). Second, the speed is assumed to vary at most linearly over the past N samples, which holds if N is reasonably small. Based on these conditions, an FIR filter interpolates a position and speed sequence in a least-squares sense. The result is shown to decrease estimation noise with no compromise in terms of dynamics up to N=5, and a limited decrease of dynamic performance at higher N. Thus, in some implementations, the output filter 156 may include a filter 158 (depicted, in FIG. 1 as a FIR filter, although other filter implementation may be realized to achieve the functionality of the filter 158) that applies, for example a least-squares filtering operation to the instantaneous estimates derived (by the unit 152) from the one or more measurement samples and at least one set of previous estimates derived according to the optimization process applied to previous one or more measurement samples. The filtering operation of the filter 158 yields refined (e.g., more robust) speed and position values that are used to generate the signal $V_{\alpha\beta}$ to control the electric motor drive 112. In some embodiments, the filtering operation realized by the filter 158 may be applied directly to the estimates derived by the optimization unit 152, i.e., the direct estimation may be performed (in such embodiments) without use of the selective filter 154. In such embodiments, the direct estimation circuit may comprise the optimization unit 152 followed by the filter 158 (which may be coupled to another downstream filter). When the filter 158 is coupled to the selective filter 154, the filter 158 may be applied to only previous estimates when the selective filter determines that the presently derived estimates should not be used.

In some embodiments, the output filter 156 may include a dual phase-lock-loop (PLL) 160 to determine subsequent speed and position values for the electric motor drive according to independent phase locked loop units applied to each of the outputted values of the speed and position determined (by the optimization unit 152) according to the optimization process based on the cost function defined for the one or more measurement samples. A dual-PLL concept uses a position PLL in parallel with a speed loop resulting from the independence of the speed estimate provided by the direct estimation circuitry 150. The dual-PLL implementation has, in some embodiments, a 1 kHz estimation bandwidth, which is more than a factor 10 higher than a conventional PLL (e.g., 50 Hz), and acts as a benchmark reference to the FIR filter 158, which achieves a 6.8 kHz bandwidth at similar absolute mean estimation errors (<1%). The dual PLL 160 may be used in conjunction with the selective filter 154, the filter 158, or both the selective filter 154 and the filter 158.

As noted, the direct estimation circuitry 150 includes the optimization unit 152 that derives independent position and speed estimates corresponding to the electric motor 114 (those estimates are then used to determine a drive control signal $V_{\alpha\beta}$ to control the motor drive 112 (generating the currents driving the motor). Direct parameter estimation targets the estimation of the unknown parameters $z \in Z \subseteq \mathbb{R}^l$ from the nonlinear dynamic system $\dot{x}=f(x, u, z)+w$, with states $x \in \mathbb{X} \subseteq \mathbb{R}^n$ and inputs $u \in \mathbb{U} \subseteq \mathbb{R}^m$ presence of an unknown bounded disturbance $w \in \mathbb{W}=\{w \in \mathbb{R}^2 | \|w\| \leq W\}$ at time instant t. For simplicity of notation, a continuous-time derivative $\dot{x}$ is obtained from two adjacent x in sampled systems. Assume that $f: \mathbb{X} \times \mathbb{U} \times Z \times \mathbb{W} \to \mathbb{R}^n$ is smooth and the sets $\mathbb{X}$, $\mathbb{U}$, $Z$, and $\mathbb{W}$ are convex. Direct estimation uses the known states x and inputs u to generate an estimate $\hat{z}=z+\tilde{z}$, where $\tilde{z}$ is the estimation error. The residuals of the dynamic system, $$r(\hat{z})=f(x,u,\hat{z})-\dot{x}+w, \quad (1)$$

act as a qualifier of an estimate $\hat{z}$. For w=0, $r(\hat{z})$=0 is a necessary condition such that $\hat{z}$=z, i.e., $\tilde{z}$=0. In these conditions, $\hat{z}$=z, implies $r(\hat{z})$=0, but the reverse is not true in general and additional provisions are necessary. Since w≠0, direct parameter estimation fits the parameters in a nonlinear least squares sense with the optimization problem:

$$\hat{z}^*=\arg_{\hat{z} \in D}\min c(\hat{z})=\|r(\hat{z})\|^2=r(\hat{z})'r(\hat{z}) \quad (2)$$

with a cost function $c: Z \to \mathbb{R}$ and search domain $\mathcal{D} \subseteq Z$. When solving Equation (2), w is unknown and assumed to be zero.

For estimation purposes the optimizer $\hat{z}^*$ has to be unique, which is provided if $c(\hat{z})$ is strictly convex on $\mathcal{D}$. In these conditions, $\hat{z}^*$=z if w=0. Any disturbance w≠0 will result in a nonzero estimation error, i.e., $\|\hat{z}^*-z\|>0$. However, it can be shown that $\|\hat{z}^*-z\|>Z_w$ for any bounded disturbance $\|w\|<W$ if $c(\hat{z})$ is strictly convex on $\mathcal{D}$. The search domain $\mathcal{D}$ can be computed explicitly but the required programs are np-hard for nonlinear systems in general. Hence, its computation can be replaced with convexity checks in real-time implementations.

For control purposes, the armature (stator) flux and currents of synchronous machines, e.g., permanent magnet (pmsm) machines, wound rotor (without damper windings) machines, and reluctance machines (rsm) are linked using the dq reference frame, $$\lambda_{dq}=l \circ i_{dq} \approx L i_{dq} + \psi_r, \quad (3)$$

where $l: \mathbb{R}^2 \to \mathbb{R}^2$ is the nonlinear map that links dq current and flux globally. The nonlinear map can be computed using finite element analysis (FEA) or measured experimentally. For control purposes, this relation is often approximated by an affine map with parameters L=diag[$L_d$, $L_q$] and $\psi_r$=[$\psi$, 0]', where $L_d$ and $L_q$ are the d and q axis inductances, and $\psi$ is the rotor flux magnitude, with ' denoting the transpose operator.

It is assumed that the affine approximation is a fit with reasonable accuracy, e.g., using optimized parameters. The implicit position dependence of the dq reference frame is made explicit by transforming into the static αβ system with the Park transformation P(θ)=[[cos θ, −sin θ], [sin θ, cos θ]'], which is orthogonal ($P^{-1}(\theta)=P'(\theta)$), $$\lambda_{\alpha\beta}=P(\theta)LP(\theta)i_{\alpha\beta}+P'(\theta)\psi_r, \quad (4)$$

where $\lambda_{dq}=P(\theta)\lambda_{\alpha\beta}$ and $i_{dq}=P(\theta)i_{\alpha\beta}$. Deriving this expression with respect to time results in the dynamic synchronous machine model $$\bar{v}_{\alpha\beta}=(L_\Sigma I + L_\Delta \bar{P}(2\theta))\dot{i}_{\alpha\beta}+2L_\Delta \omega \bar{JP}(2\theta)i_{\alpha\beta}+\omega JP(\theta)'\Psi \quad (5)$$

where $L_\Sigma=(L_d+L_q)/2$ and $L_\Delta=(L_d-L_q)/2$ is the sum and difference inductance, respectively. The compensated terminal voltage $\bar{v}_{\alpha\beta}=\dot{\lambda}_{\alpha\beta}=v_{\alpha\beta}-\Delta v_{\alpha\beta}$ is the terminal voltage applied by control $v_{\alpha\beta}$ compensated with the effective voltage drop $\Delta v_{\alpha\beta}$ due to the stator resistance, inverter on-voltage drops, and deadtimes. The $\Delta v_{\alpha\beta}$ term is related to the power losses in the current conduction path. It is typically a few percent of $v_{\alpha\beta}$ and can be approximated with lookup tables or analytical models without knowledge of θ or ω. The matrices J=[[0, 1]', [−1, 0]'], is a π/2 rotation, I=[[1, 0]', [0, −1]'], and $\bar{P}(\theta)=P'(\theta)I^{-}P(\theta)$.

Direct position and speed estimation use the dynamic model of Equation (5), above, to derive estimates. The numerical performance of the cost function is improved by normalizing the estimates with $\hat{z}=[\hat{\theta}/\Theta, \omega/\Omega]'$, where $\Theta=\pi$ is the rated position and $\Omega \in \mathbb{R}>0$ is the base speed. The estimates describe the parameters $\hat{z}=[\theta/\Theta, \omega/\Omega]'$ with estimation error $\tilde{z}=\hat{z}-z=[\tilde{\theta}/\Theta, \tilde{\omega}/\Omega]'$. The residual function of Equation (1) results from Equation (5) defining the state $x=i_{\alpha\beta}$ and input $u=\bar{v}_{\alpha\beta}$.

$$r(\hat{z})=(L_\Sigma I+L_\Delta \bar{P}(2\hat{\theta}))\dot{i}_{\alpha\beta}+2L_\Delta \hat{\omega} J\bar{P}(2\hat{\theta})\Psi_r-\bar{v}_{\alpha\beta} \quad (6)$$

where $\dot{i}_{\alpha\beta}$, $i_{\alpha\beta}$, $\bar{v}_{\alpha\beta}$ are known at any sampling instant. The cost function follows immediately by substituting Equation (6) into Equation (2).

The estimation problem of Equation (2) can be solved numerically in real-time. The solver (implementing the derivation process to obtain a solution in FIG. 1, the unit 152 may be referred to as the "solver") can start, in some examples, with a guess $\hat{\theta}_g, \hat{\omega}_g$, that is typically chosen as the (extrapolated) estimate of the previous sample. In some implementations, a Newton solver can be used that updates the estimates using the Newton step $\Delta z=\gamma \mathcal{H}^{-1}_c(\cdot)\nabla c(\cdot)$, where $\mathcal{H}^{-1}_c(\cdot) \in \mathbb{R}^{2\times 2}$ is the Hessian, and $\nabla c(\cdot) \in \mathbb{R}^2$ is the gradient of the cost and, γ is the step-size. The solver stops either when a convergence criterion is satisfied (typically $\|\nabla c(\cdot)\| \leq \epsilon$, with $\epsilon \in [10^{-2}, 10^{-5}]$), or the maximum number of iterations M is reached (typically M $\in$ [1, 5]). In practice, the solver may not converge at some samples. In such events, the solver returns the initial guess since $\hat{\theta}^*=\hat{\theta}_g$, $\hat{\omega}^*=\hat{\omega}_g$ is preferable to a random result.

In some embodiments, estimates can be derived using numerical computation techniques. In one example implementation, at each sampling instant, a numerical solver obtains the stationary point of the cost function $\bar{c}(\cdot)$ by producing a sequence of iterates $\hat{z}_0, \ldots, \hat{z}_j, \ldots, \hat{z}^*$. The sequence starts with an initial guess $\hat{z}_g=\hat{z}_0$, and ends with the optimizer $\hat{z}^*$ that identifies the (normalized) parameters z with accuracy, e.g., $\|z-\hat{z}^*\|\leq\varepsilon$, $\varepsilon\in\mathbb{R}_{>0}$. The sequence is generated identifying a suitable step $\Delta j$ and stepsize $\alpha_j$, $$\hat{z}_{j+1}=\hat{z}_j+\alpha_j\Delta_j.$$

The stepsize $\alpha_j$ may be chosen with a suitable linesearch technique to accelerate and robustify convergence. An Example of a linesearch technique that can be used is the "golden section" search technique. The step $\Delta_j$ can be determined with first or second order methods.

The nonlinear conjugate gradient method is a first order method that identifies a stationary point of a differentiable cost function. It avoids the "zig-zag" nature of the steepest descent method by following the conjugate direction $\Delta_j=-\nabla c(\hat{z}_j)+\beta_j\Delta_{j-1}$ (with $\Delta_0=-\nabla c(\hat{z}_j)$). The parameter $\beta_j$ can be computed using several formulae, including, for example, the Fletcher-Reeves formula which provides $\beta_j=\|\nabla c(\hat{z}_j)\|^2/\|\nabla c(\hat{z}_j-1)\|^2$. The conjugate gradient method is observed to identify estimates robustly even if the cost is quasi-convex. The second order Newton method identifies the roots of a twice differentiable function by approximating the function with its second order Taylor series in $\hat{z}_j$. This approximation can be solved for its minimum resulting in $\Delta_j=-H_c^{-1}(\hat{z}_j)\nabla c(\hat{z}_j)$. The Newton method converges significantly faster than the conjugate gradient method in convex problems, but is less reliable in quasi-convex regions. A reference solver may be implemented that combines the benefits of the gradient and Newton method. Since $\nabla c(\hat{z}_j)$ and $H_c^{-1}(\hat{z}_j)$ are computed at each time step, the solver can check efficiently for strict convexity and quasi-convexity, resulting in the step $$\Delta_j = \begin{cases} -H_c^{-1}(\hat{z}_j)\nabla c(\hat{z}_j), & \text{if: } \hat{z}_j \in L \\ -\nabla c(\hat{z}_j)+\beta_j\Delta_{j-1}, & \text{if: } \hat{z}_j \in Q\setminus L, \text{ and: } j>0 \\ -\nabla c(\hat{z}_j), & \text{if: } \hat{z}_j \in Q\setminus L, \text{ and: } j=0 \\ 0 & \text{otherwise} \end{cases}$$

If $\hat{z}_j$ is in the strictly convex region, the Newton step can be employed to maximize convergence. If $\hat{z}_j$ is in the quasi-convex region, the conjugate gradient step is used to increase the region of convergence. Thus, in some embodiments, the following estimation process can be executed at each sampling instant:

Obtain guess $\hat{z}_g$ by extrapolating previous estimate $$j \leftarrow 0, \hat{z}_0 \leftarrow \hat{z}_g, \Delta_0 \leftarrow \frac{1}{\varepsilon}[1]^l$$

while $j<N_{x,max}$ and $\|\Delta_j\|>\epsilon$ do
   Compute $\Delta_j$ according to the above expression
   Compute $\alpha_j$ with golden section line search $$\hat{z}_{j+1}\leftarrow\hat{z}_j+\alpha_j\Delta_j, j\leftarrow j+1$$

end while
Return $\hat{z}_j$

If the problem lacks quasi-convexity, the solver cannot issue a meaningful estimate. Instead, the guess $\hat{z}_g$ may be returned (which may correspond to the extrapolated estimate from the previous sample).

In some examples, to obtain a meaningful estimate, the cost function should be strictly convex in a neighborhood of the origin, which depends on $i_{\alpha\beta}$, $i_{\alpha\beta}$, $\bar{v}_{\alpha\beta}$, and $\omega$. This requirement typically holds, except in steady-state conditions $i_{\alpha\beta}=0$, at $\omega=0$ (i.e., when the rotor is stationary or is operating at low speed). To prevent position estimation challenges at $\omega=0$, an excitation or perturbation strategy may be used, in which a perturbation source, such as the source 132, injects a perturbation signal to the signal outputted by the inverse Park transformation unit 130 of FIG. 1. Possible perturbation strategies include injection of a pulsating sinusoidal signal along a predefined dq axis, or a vector that rotates at high frequencies in the dq space. Since the perturbation is needed mostly at low speeds, the injection magnitude can be reduced as the speed increases to prevent unnecessary losses. Such periodic perturbation strategies are beneficial using PWM control. On the other hand, the switching harmonics are visible to control strategies that actuate switching states directly such as direct torque control (DTC) or FCS-MPC. Such controllers generally do not achieve electric steady-state conditions, and the inherent random perturbation is typically sufficient to estimate position and speed. It is noted that FCS-MPC tends to stop switching at the operation point $i_{dq}=0$ and $\omega=0$, where the current ripple tends to zero. This behavior can be avoided by adding a small random value to the current reference at small $\omega$. High magnitude, high frequency perturbations tend to drive currents in the magnetic iron and PM. These parasitic currents depend on the motor geometry and result in additional motor losses. Hence, perturbation magnitudes are typically chosen as a compromise between drive system efficiency and estimation robustness.

Figure 2:
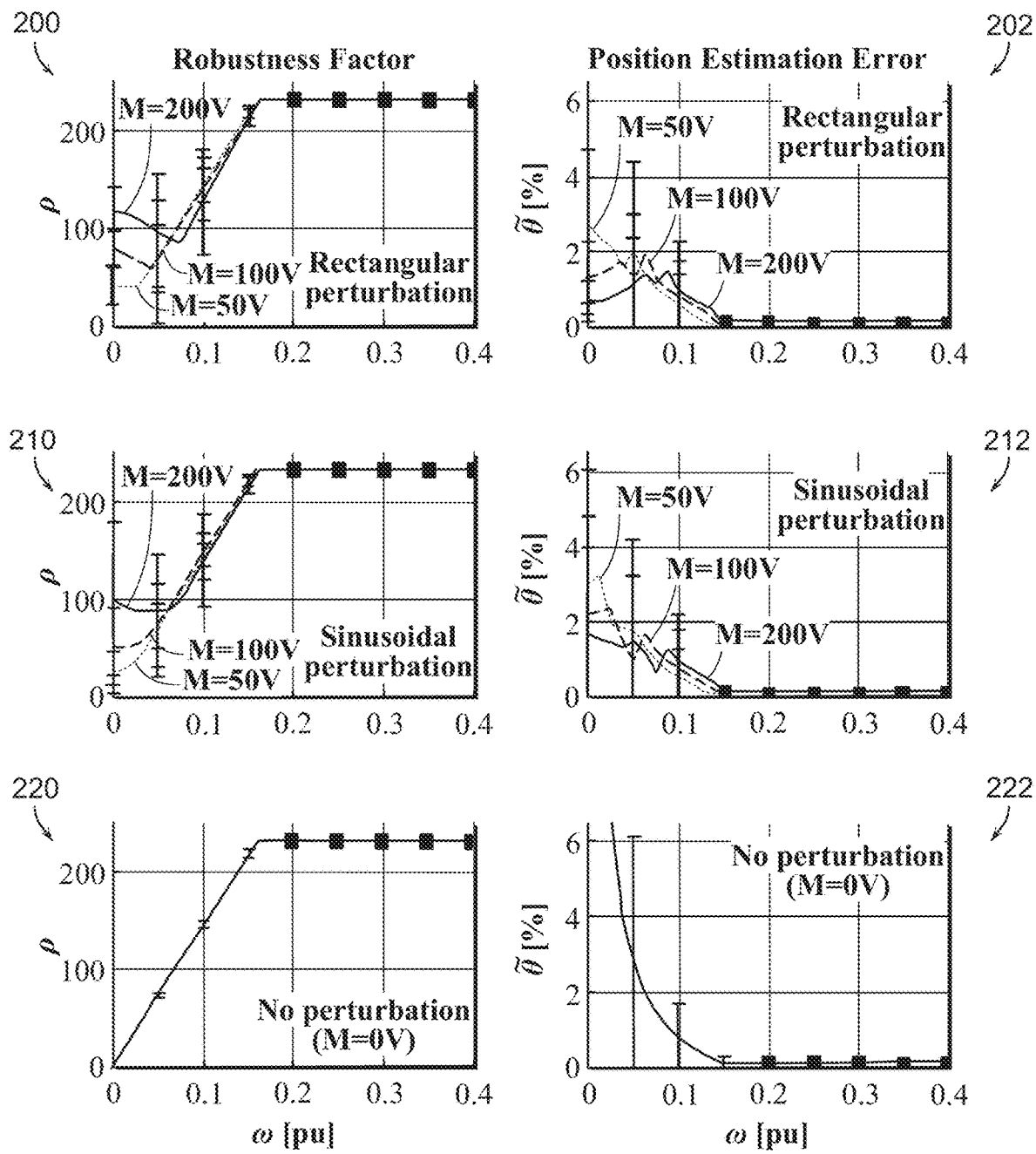
FIG. 2 are graphs showing the robustness factors and position estimation errors resulting from the testing of several perturbation schemes with the implementations described herein.

FIG. 2 includes graphs showing the robustness factors and position estimation errors resulting from the testing of several perturbation schemes with the implementations described herein. Those perturbation signals included a rectangular perturbation signal (corresponding to a robustness factor graph 200 and a position estimation error graph 202), and a sinusoidal perturbation signal (corresponding to a robustness factor graph 210 and a position estimation error graph 212). A robustness factor graph 220 and its corresponding position estimation error graph 222 were generated when the situation of no perturbation signal was tested. Based on the results provided in the graphs of FIG. 2, a robustness factor $\rho$ representative of an upper error bound against disturbances is determined. The (inverse) correlation with the estimation error is shown on the example of the position error as a function of speed for a (rotating) rectangular signal (the graph 202), a (rotating) sinusoidal signal (in the graph 212), and with no perturbation signal (in the graph 222). The perturbation magnitude M tested was 200V (solid line), 100V (dashed line), and 50V (dotted line), which corresponded to 25%, 12.5%, and 6.25% of the dc voltage, at 0 rpm and scaled linearly to zero at 15% of the rated speed.

In some embodiments, and as noted above, a perturbation signal that is effective in improving robustness (and thus reducing estimation error) of the cost functions (defined for a set of measurements) is a signal that includes, at least in part, linear slopes. An example of such a signal is a triangular signal whose rising and falling portions have slopes that exceed some minimum slope threshold. The cost function $\tilde{c}(0)$ is known to be strongly convex ($\mathcal{H}c(\tilde{\ }0)\geq m>0$). The strength m is represented as:

$$m = \lambda_{min}(H_{\tilde{c}}(0)) = \frac{d_1+d_3}{2} - \sqrt{\left(\frac{d_1-d_3}{2}\right)^2+d_2^2},$$

where $d_1$, $d_2$, and $d_3$, are defined according to:

$$d_1 = 2\Theta^2((\dot\xi_d + \omega\xi_q)^2 + (\dot\xi_q + \omega\xi_d)^2) = 2\Theta^2 \|\dot\xi_{dq} - \omega J \xi_{dq}\|$$

$$d_2 = 2\Theta\Omega((\dot\xi_d \xi_d + \dot\xi_q \xi_q)^2 + (\dot\xi_q + \omega\xi_d)^2) = 2\Theta\Omega \dot\xi'_{dq}\xi_{dq}$$

$$d_3 = 2\Omega^2(\xi_d^2 + \xi_q^2) = 2\Omega^2 \|\xi_{dq}\|^2$$

The parameter m can be small, e.g., at $\omega=0$, which compromises the robustness properties such that a small error w could result in a large estimation error $\tilde z_w$. A minimum m, i.e., a minimum convexity of the cost function in the origin, can be guaranteed (under most circumstances, although not always in surface mount (isotropic) permanent magnet synchronous machines) with an appropriate zero-mean perturbation. For simplicity of notation, assume that near steady-state conditions, where $\dot\xi_{dq}$ is predominantly created by a perturbation signal. It can be shown that any zero-mean perturbation $\dot\xi_{dq} = \gamma J \xi_{dq}$, where $\gamma \in \mathbb{R}$ satisfies $|\gamma - \omega| \geq \Omega/\Theta$ implies $m = 2\Omega^2 \|\xi_{dq}\|^2$. A perturbation $\dot\xi_{dq} = \gamma J \xi_{dq}$ is orthogonal to $\xi_{dq}$ such that $\dot\xi_{dq}\xi_{dq} = 0$, i.e., $d_2 = 0$. By substitution, m can be represented as:

$$m = \lambda_{min}(H_c(0)) = \min\{2\Theta^2\|\dot\xi_{dq} - \omega J \xi_{dq}\|^2, 2\Omega^2\|\xi_{dq}\|^2\} = 2\|\xi_{dq}\|^2 \cdot \min\{(\gamma-\omega)^2\Theta^2, \Omega^2\}$$

Hence, $m = 2\Omega^2 \|\xi_{dq}\|^2$ if $|\gamma - \omega|\Theta \geq \Omega$. Therefore, any perturbation, which satisfies $\dot\xi_{dq} = \gamma J \xi_{dq}$ with $|\gamma - \omega| \geq \Omega/\Theta$, guarantees an estimation error of:

$$\|z_w^*\| \leq \frac{2}{\sqrt{m}}\|w\| = \frac{\sqrt{2}}{\Omega\|\xi_{dq}\|}\|w\|$$

It is possible to construct a perturbation current $i_{p,dq}$ that results in $i_{p,dq} = i_{dq}$, and satisfies:

$$i_{p,dq} = \gamma J \left(i_{dq} + \begin{bmatrix}\frac{\psi}{2L_\Delta} \\ 0\end{bmatrix}\right), \text{ with } \begin{cases}\gamma = 0 & \text{if } |\omega| \geq \Omega/\Theta \\ \gamma \geq \gamma_p & \text{or,} \\ \gamma \leq \gamma_n & \text{otherwise}\end{cases}$$

where $\gamma_p = \omega + \Omega/\Theta \in \mathbb{R} > 0$ and $\gamma_n = \omega - \Omega/\Theta \in \mathbb{R} < 0$ define the minimum rising and falling slopes, respectively. The constant (minimum) slopes define the following zero-mean triangular signal:

$$i_{p,dq} = \begin{cases} 0 & \text{if } |\omega| \geq \Omega/\Theta \\ -I_p + \gamma_p J \left(i_{dq} + \begin{bmatrix}\frac{\psi}{2L_\Delta} \\ 0\end{bmatrix}\right) & 0 \leq t \leq dT \\ I_p - \gamma_n J \left(i_{dq} + \begin{bmatrix}\frac{\psi}{2L_\Delta} \\ 0\end{bmatrix}\right) & dT \leq t \leq T \end{cases}$$

with duty cycle Band perturbation magnitude $I_p$ defined by:

$$d = \frac{|\gamma_n|}{(\gamma_p + |\gamma_n|)}, I_p = \frac{\gamma_p}{2} dT J \left(i_{dq} + \begin{bmatrix}\frac{\psi}{2L_\Delta} \\ 0\end{bmatrix}\right)$$

Figure 3A:
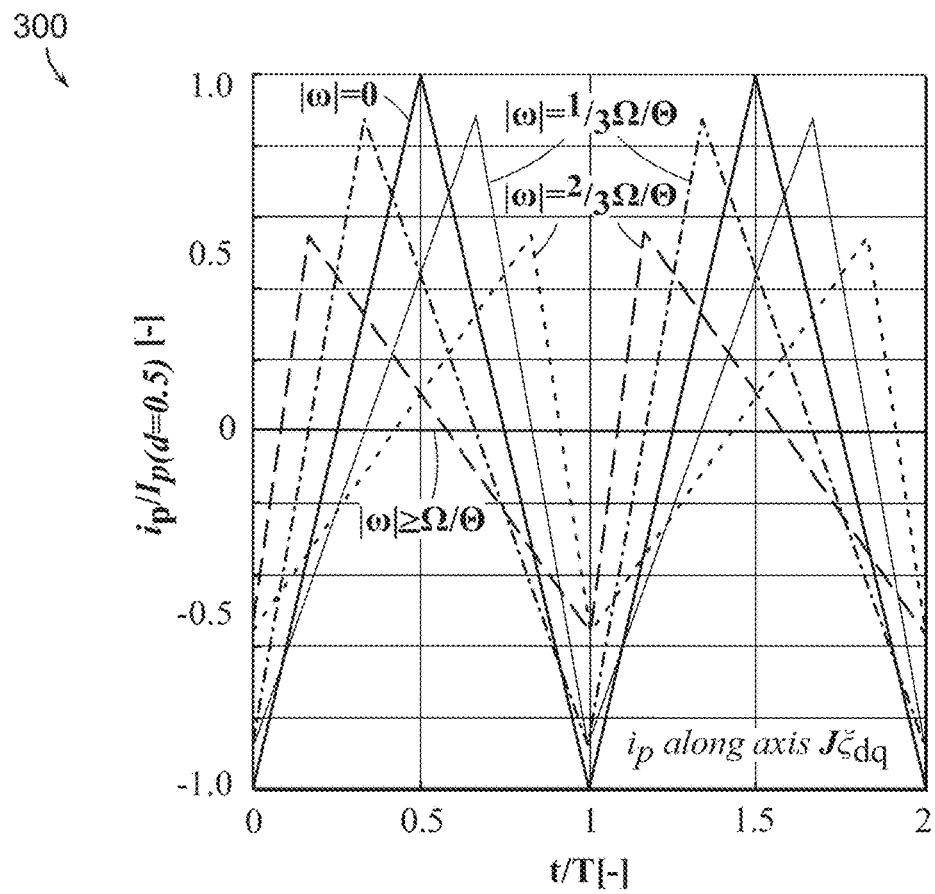
FIG. 3A is a graph illustrating a triangular perturbation signal.
Figure 3B:
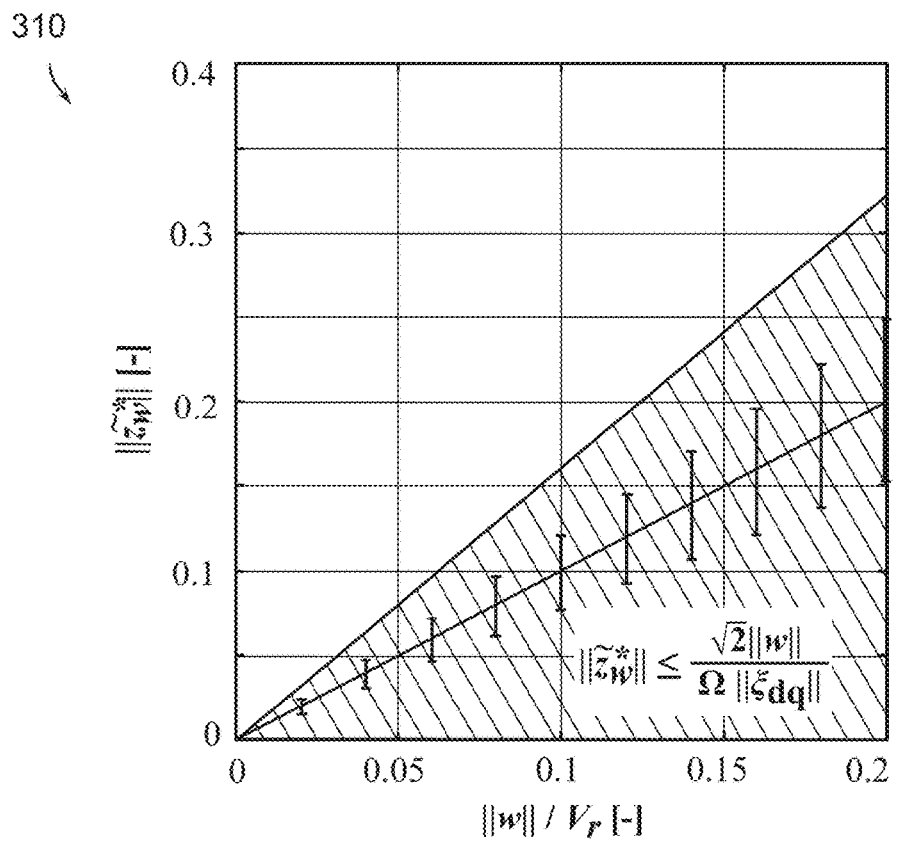
FIG. 3B is a graph estimation error and error bounds as a function of $\|w\|$ with robust perturbation signals.
Figure 4A:
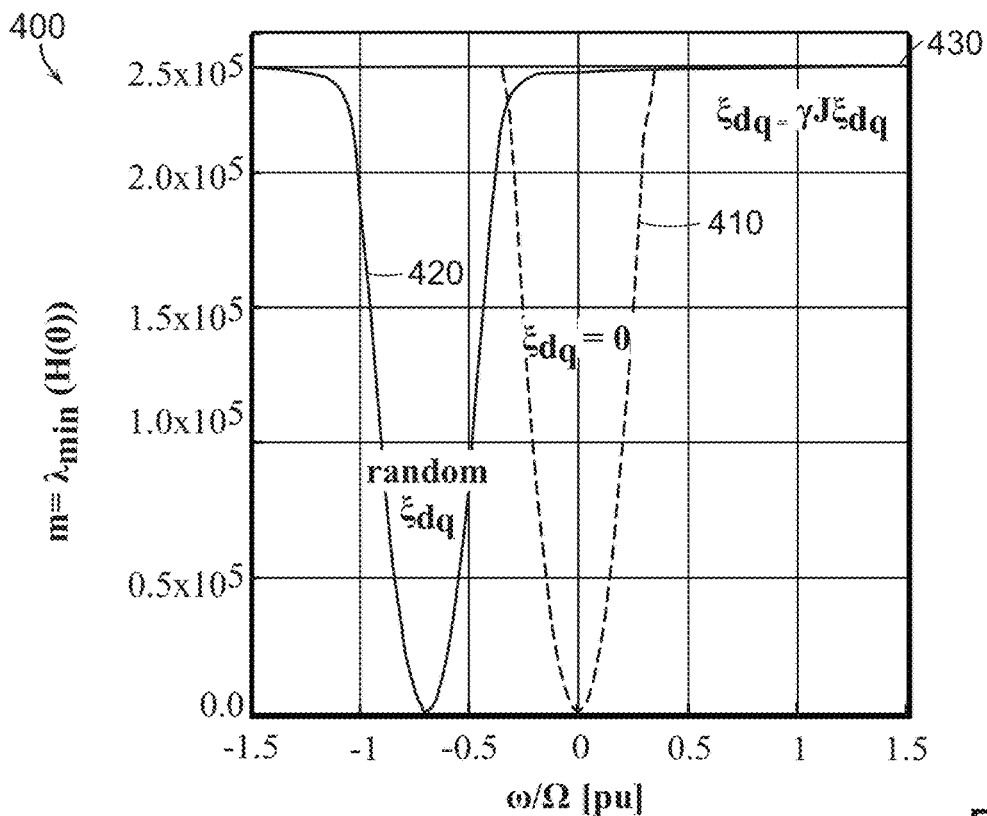
FIG. 4A is a graph providing a comparison of the convexity strengths for various types of perturbation signals.
Figure 4B:
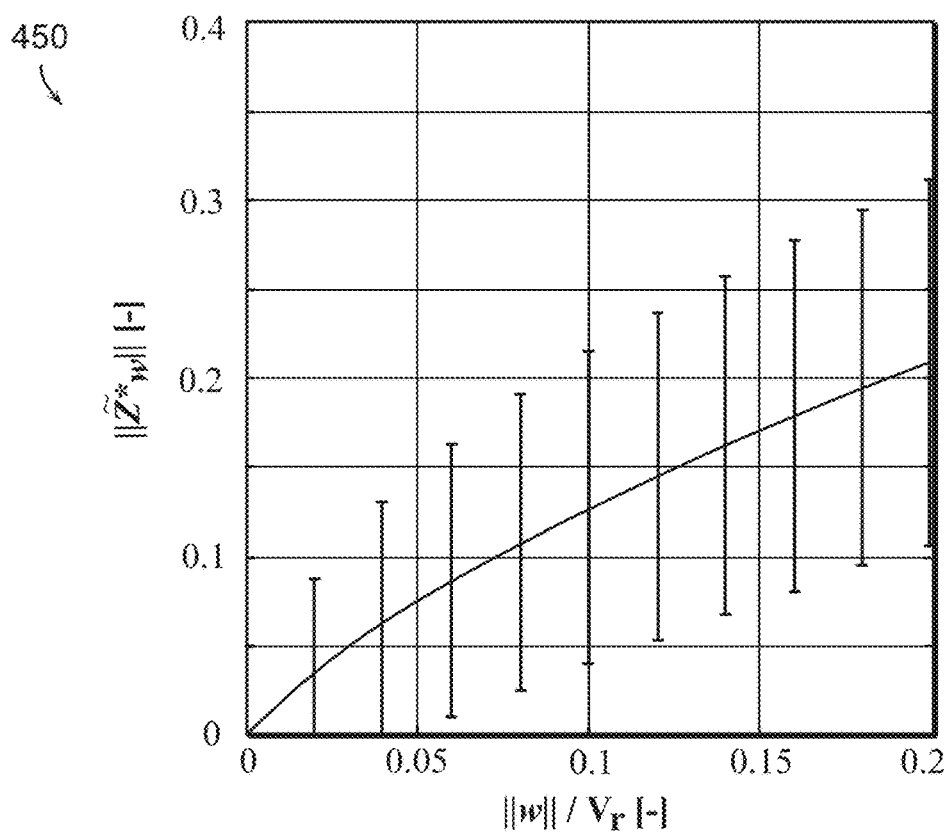
FIG. 4B is a graph of the estimation error as a function of $\|w\|$ for a random perturbation signal.

With reference to FIG. 3A, a graph 300 illustrating a triangular perturbation signal $i_p$ is shown (normalized with $I_p$ at d=0.5, and plotted along the axis $J\xi_{dq}$). The illustrated signals provide zero-mean robust perturbations satisfying $\dot\xi_{dq} = \gamma J \xi_{dq}$. FIG. 3B is a graph 310 of the estimation error $\|\tilde z_w^*\|$ and error bounds as a function of $\|w\|$ with robust perturbation (by signals such as those depicted in FIG. 3A, satisfying $\dot\xi_{dq} = \gamma J \xi_{dq}$ (1M random operation points per marker). FIG. 4A is a graph 400 providing a comparison of the convexity strengths m at $\tilde c(0)$ for the cases of no perturbation (curve 410), random perturbation (curve 420), and robust perturbation (curve 430) satisfying $\dot\xi_{dq} = \gamma J \xi_{dq}$ (1M random operation points per marker). FIG. 4B includes a graph 450 of the estimation error $\|\tilde z_w^*\|$ as a function of $\|w\|$ for the case involving random perturbation (1M random operation points per marker, excluding points lacking identifiability).

It is noted that machines with high $$\left|\frac{\psi}{2L_\Delta}\right|$$

require a small period T, i.e., a high frequency perturbation, such that $I_p$ is a reasonable compromise in terms of robustness. Also, the resulting slopes can exceed the capabilities of a current control loop. In such cases, a triangular current perturbation can be mapped onto a rectangular voltage signal that is actuated by a PWM module.

As noted, one way to improve the performance of the sensorless direct position and speed estimation for an electric motor is through the use of a selective filter (e.g., such as the selective filter 154) that is applied to the most recent (currently) estimates derived by the optimization process (e.g., via the optimization unit 152 of FIG. 1) for the most recent measurement samples. Direct estimation issues independent estimates for the position, $\hat\theta^*_k$, and the speed, $\hat\omega^*_k$, at each sampling instant $kT_s$, where $T_s$ is the sampling time. The residual $r_k(\cdot)$ and cost $c_k(\cdot) = \|r_k(\cdot)\|^2$ are parameterized with the state $i_{\alpha\beta,k}$, input $\bar v_{\alpha,\beta,k}$ and state derivative $\dot i_{\alpha,\beta,k}$, which is typically approximated with $\dot i_{\alpha,\beta,k} \approx (i_{\alpha,\beta k+1} - i_{\alpha,\beta,k})/T_s$. However, the estimates can be noisy due to any disturbance w, e.g., current sensor noise or inverter nonlinearities such as interlock times or on-voltage drops. Thus, it is beneficial to introduce filtering strategies that maintain the high dynamic performance but inhibit, or all together prevent, a "bad" sample results in a large estimation error. Therefore, filtering strategies are used that issue the filtered position $\bar\theta^*_k$ and speed $\bar\omega^*_k$ from the derived estimates $\hat\theta^*_k$ and $\hat\omega^*_k$.

In some embodiments, the selective filtering approach uses cost function properties to perform the filtering operations. The cost function $c_k(\cdot)$ is required to be strictly convex on $\mathcal{D}_k$ such that a meaningful estimate can be issued. Thus, this concept requires that the cost function be strictly convex in the estimate, or generalizing strongly convex, i.e. $\mathcal{H}_{ck}(z_k) \geq m_k > 0$, where $m_k = \lambda_{min}(\mathcal{H} c_k(z_k))$ is the minimum eigenvalue of the Hessian evaluated in $z_k$. Linearizing the residual $r_k(\cdot)$ in $z_k$, it is possible to link strength of convexity with the estimation error due to a disturbance. Introducing the robustness factor $\rho_k = \sqrt{m_k}/2$, it can be shown that $\|\tilde z^*_k\| \leq \|w_k\|/\rho_k$ is a tight upper bound on the estimation error. Since the disturbance magnitude is finite, i.e., $\|wk\| \leq W$, the estimation error magnitude $\|\tilde z^*_k\|$ depends on $\rho_k$. This property is shown empirically in the graphs of FIG. 2.

In practice, $w_k$ is unknown. However, the eigenvalues of the cost function $m_k$, and therefore $\rho_k$, are revealed by the Newton solver. Since, samples with low $\rho_k$ have a poor robustness against disturbances, it is feasible to selectively filter samples where $\rho_k < \rho_{min}$. Such filtering operation can be implemented, for example, based on the use of an "if" statement at the output of the solver/optimizer, which replaces each sample lacking robustness with, in some embodiments, the initial guess or a previous estimate (e.g., a previous computed by the optimization unit 152, or the filtered output of the unit 150).

As further noted above, in some situations, another filtering approach that can be used with the selective filter, or instead of it, is to apply a filter (such as the filter 158 of FIG. 1) to the currently derived estimates and one or more of the previously computed instantaneous estimates (derived using an optimization process applied to previous measurements samples). As discussed herein, the optimization unit (solver) 152 issues independent position $\hat{\theta}^*_k$ and speed $\hat{\omega}^*_k$ estimates at each sampling instant k. These estimates are derived exclusively as the solution to the cost function defined by the measured samples (e.g., the current $i_{\alpha\beta}$ and/or its derivative, and the control signal $V_{\alpha\beta}$ generated by the motor control circuitry 120). However, the mechanical system is subject to constraints as well. For example, the speed cannot vary arbitrarily fast since it is related to kinetic energy stored in the mechanical system. Also, the mechanical parameters should satisfy the equation $\theta_{k+1}=\theta_k+T_s\omega_k$. Hence, it is possible to introduce a moving-window least-squares fit of the estimates over the past N samples, where N is typically small, e.g., a few samples in order to limit the computational complexity. Filters implementing other processing or filtering schemes can alternatively be used.

Over short horizons, the speed can often be assumed to be constant without excessive errors. In testing and evaluations performed for the implementations described herein, it has been found that the speed can be assumed to vary linearly over the horizon, i.e., $\hat{\omega}^*_{k+1}=\hat{\omega}^*_k+a$, for higher accuracy. This requirement can be written as an equation system that fits the absolute speed, $$\hat{\omega}^*_k = b$$
$$\hat{\omega}^*_{k+1} = b - a$$
$$...$$
$$\hat{\omega}^*_{k-N} = b - Na$$

It is noted that the assumption of a linear speed variation is fairly accurate for N={1, 2} in a sampled system, and is just an approximation otherwise (i.e., accuracy decreases as N increases). It is possible to increase the accuracy by introducing higher order polynomials but at the expense of an increased computation complexity. Furthermore, the estimates should fit the equation $\hat{\theta}^*_{k+1}=\hat{\theta}^*_k+T_s\hat{\omega}^*_k$. This requirement can be written as an equation system that fits the differential position, $$\hat{\theta}^*_k - \hat{\theta}^*_{k-1} = T_s(b - a)$$
$$\hat{\theta}^*_{k-1} - \hat{\theta}^*_{k-2} = T_s(b - 2a)$$
$$...$$
$$\hat{\theta}^*_{k-N-1} - \hat{\theta}^*_{k-N} = T_s(b - Na)$$

The absolute position results from the integration of the speed with initial offset. This system results in the requirement $$\hat{\theta}^*_k = c$$
$$\hat{\theta}^*_{k-1} = c - T(b - a)$$

$$\hat{\theta}^*_{k-2} = c - T(b - a) - T(b - 2a)$$
$$...$$
$$\hat{\theta}^*_{k-N} = c - T(Nb - ((1 + 2 + ... + N)a).$$

These systems can be combined and written in matrix form $H\xi=F$, where $\xi=[a, b, c]'$ and $F=[\hat{\omega}^*_k, ..., \hat{\omega}^*_{k-N}, \hat{\theta}^*_k-\hat{\theta}^*_{k-1}, ..., \hat{\theta}^*_{k-N+1}-\hat{\theta}^*_{k-N}, \hat{\theta}^*_k, ..., \hat{\theta}^*_{k-N}]'$, and:

$$H = \begin{bmatrix} 0 & 1 & 0 \\ -1 & 1 & 0 \\ -2 & 1 & - \\ ... \\ -N & 1 & 0 \\ -T_s & T_s & 0 \\ -2T_s & T_s & 0 \\ -3T_s & T_s & 0 \\ ... \\ -NT_s & T_s & 0 \\ 0 & 0 & 1 \\ T_s & T_s & 1 \\ 3T_s & 2T_s & 1 \\ ... \\ \frac{n(n+1)}{2} & NT_s & 1 \end{bmatrix}$$

The above equation system is overdetermined for N>0. Hence, the variable can be fitted in a least-squares sense. The result is provided by $\xi=H\dagger F$, where $\cdot\dagger$ denotes the Moore-Penrose pseudoinverse. The computation is feasible in real-time since H is constant and $H\dagger$ can be stored in memory. The resulting FIR filter thus solves a least-squares problem over a moving horizon N. It issues the fit $\xi=[a, b, c]'$, where $b=\hat{\omega}^*_{f,k}$ and $c=\hat{\theta}^*_{f,k}$ are the filtered position and speed, respectively. For N=0, the fit will return the original values $b=\hat{\omega}^*_{f,k}=\hat{\omega}^*_k$ and $c=\hat{\theta}^*_{f,k}=\hat{\theta}^*_k$.

As noted above, in some embodiments, a phase-locked loop implementation may be included with the output filter 156 of the direct estimation unit 150, in order to refine the speed and position estimates through a PLL tracking operation. For large N, the filter 158 (e.g., FIR filter) can become computationally heavy for real-time implementations since it requires 3N floating point multiplications and additions. An alternative is the phase-locked loop (PLL), which may be used in conjunction with the selective filter 154 and/or the FIR filter 158, or separately and independently from the selective filter 154 or the FIR filter 158.

Figure 5:
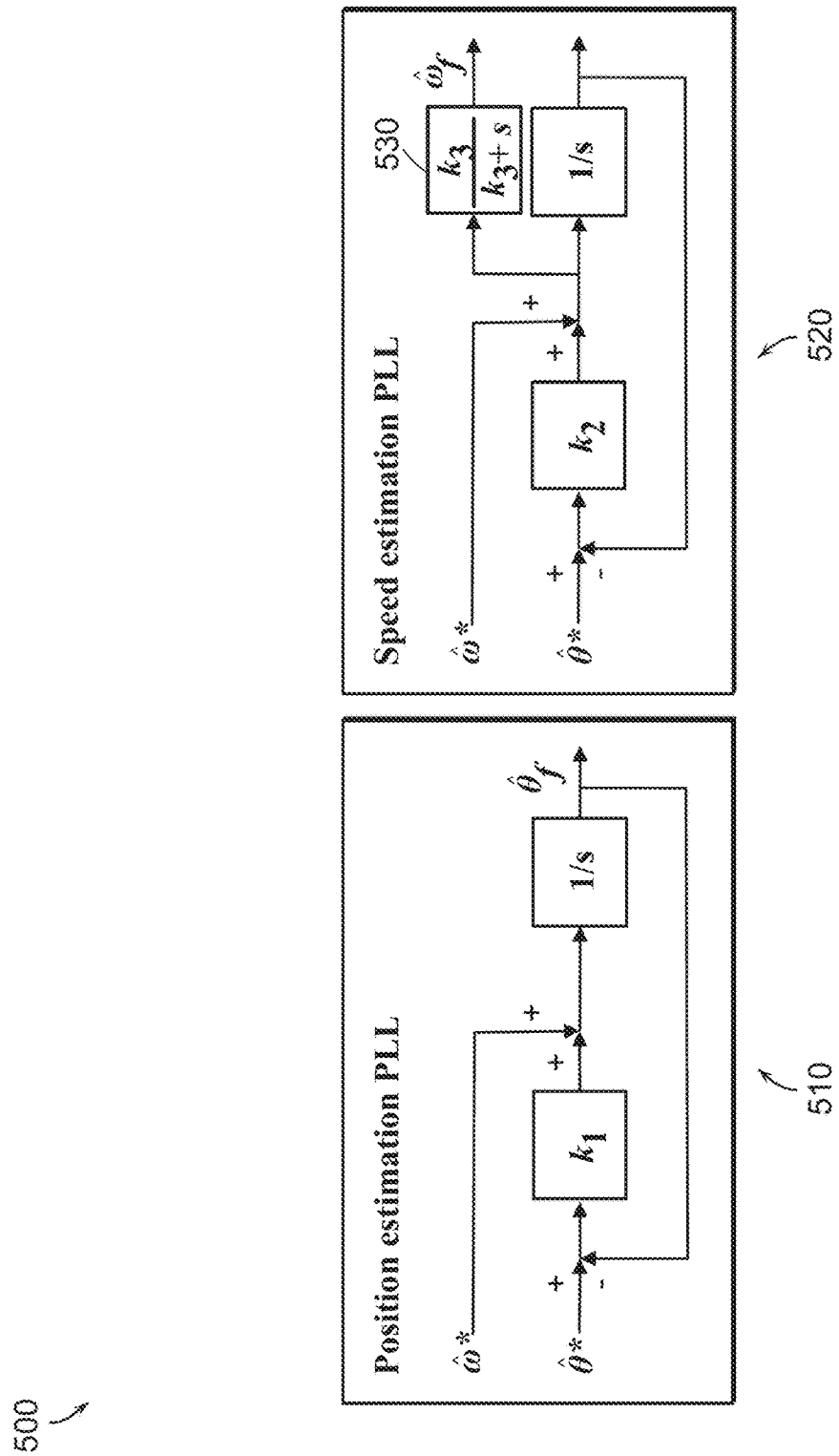
FIG. 5 is a block diagram of an example dual PLL implementation.

A PLL typically tracks the position and co-estimates speed (although the latter is typically noisy for high PLL gains, i.e., high PLL bandwidths). However, direct estimation (e.g., using the direct estimation unit 150) provides both a position and speed signal estimates. Therefore, two PLL circuits can be used, one for refined position estimation and one for refined speed estimation. FIG. 5 is a block diagram of an example dual PLL implementation 500. The dual PLL implementation 500 includes a position estimation PLL 510 that uses a fast feedback loop (high gain, $k_1$) is used to achieve a filtered position estimate $\hat{\theta}^*_f$ with high bandwidth. The speed estimation PLL filter 520 uses a slow feedback loop (low gain, $k_2$) to remove speed offsets with respect to the position increment. A low-pass filter 530 with bandwidth $k_3$ is used to filter the speed feed-forward term and provides the filtered speed estimate $\hat{\omega}_f$.

The position-estimation PLL uses, in some implementations, the typical layout augmented with a speed feed-forward term. The position estimation PLL relies primarily on the $\hat{\theta}^*$ input to issue a filtered position estimate $\hat{\theta}^*_f$ with the transfer function $$tf_\theta = \frac{\hat{\theta}^*_f}{\hat{\theta}^*} = \frac{k_1}{k_1 + s}.$$

The speed-estimation PLL follows a similar structure but may use a slow feedback ($k_2 \ll k_1$) to remove a speed offset with respect to the position increment. Furthermore, a low-pass filter is added to limit the bandwidth of the speed feed-forward term. The speed-estimation PLL relies primarily on the $\hat{\theta}^*$ input to issue a filtered speed estimate $\hat{\omega}^*_f$ with the transfer function:

$$tf_\omega = \frac{\hat{\omega}^*_f}{\hat{\omega}^*} = \frac{k_3}{k_3 + s}.$$

In the description provided herein, the structure of FIG. 5 is referred to as a dual-PLL. The dual-PLL acts also as a benchmark reference for the FIR filter concept. On the experimental test-bench (described below in greater detail) used for evaluating some of the implementations described herein, the dual-PLL is stable up to $f_{pll,bw} = 1$ kHz bandwidth, i.e., ¹⁄₂₀ of the sampling frequency, with tuning $k_1 = 2\pi f_{pll,bw}$, $k_2 = 10^{-2} k_1$, and $k_3 = k_1$. In contrast, a conventional PLL is limited to about 50 Hz bandwidth due to noise on the speed estimate.

Figure 6A:
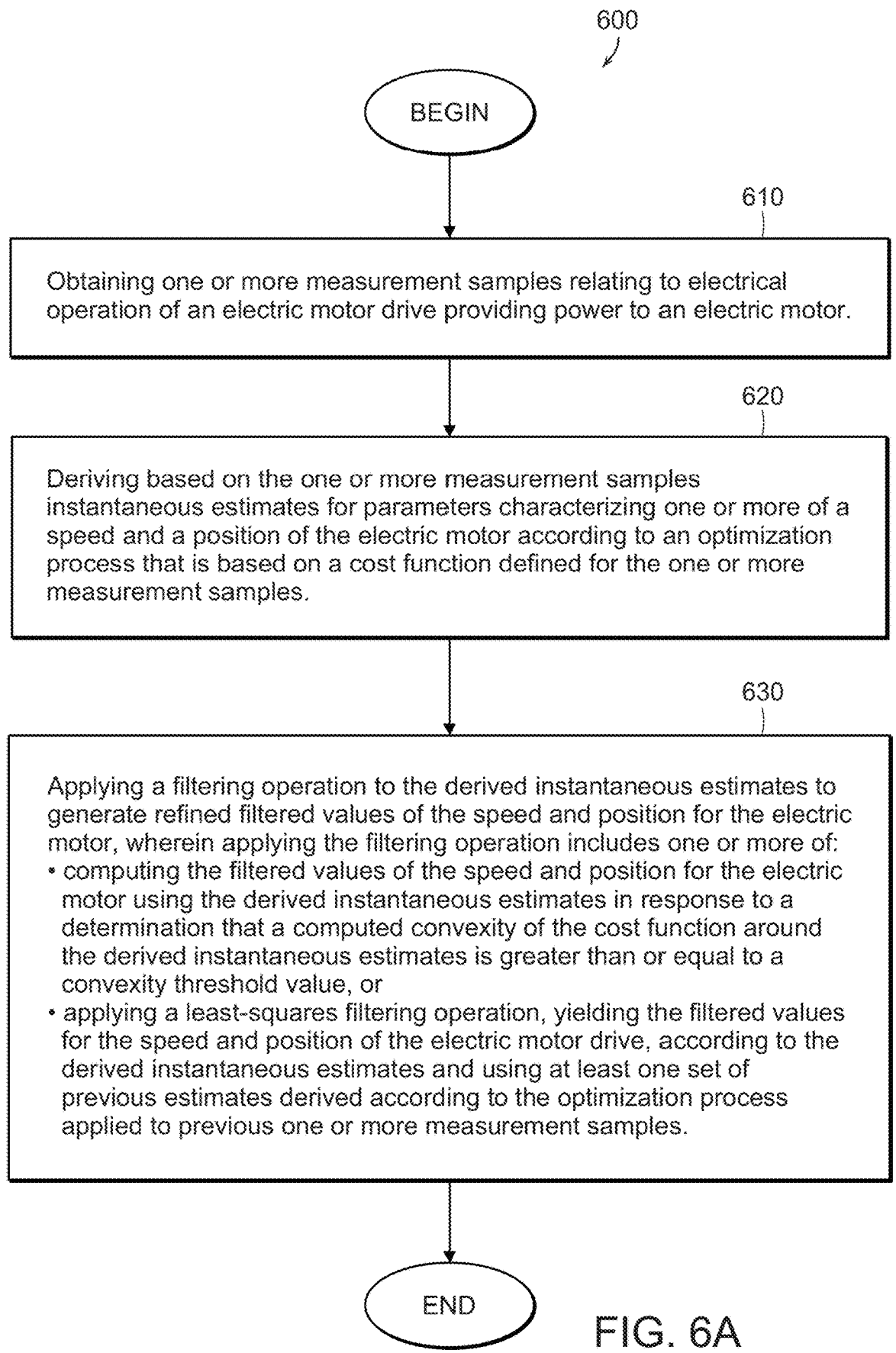
FIGS. 6A and 6B are flowcharts of example procedures to determine speed and position estimates for a sensorless electric motor system.

With reference next to FIG. 6A, a flowchart of an example procedure 600 to determine speed and position estimates for a sensorless electric motor system (such as the $V_{\alpha\beta}$ signal) to control an electric motor drive (such as the PWN/SVM drive 112) that drives (actuates) an electric motor (e.g., the motor 114 of FIG. 1) is shown. The procedure 600 includes obtaining 610 one or more measurement samples relating to electrical operation of an electric motor drive providing power to an electric motor. For example, obtaining the one or more measurement samples may include obtaining one or more of, for example, controlled current provided to the electric motor by the motor drive (e.g., the current $i_{\alpha\beta}$ sensed by the sensor 116), a derivative of the controlled current, and/or the control signal (e.g., $V_{\alpha\beta}$) provided as input to the electric motor drive.

The procedure 600 additionally includes deriving 620, based on the one or more measurement samples, instantaneous estimates for parameters characterizing one or more of a speed and a position of the electric motor according to an optimization process that is based on a cost function defined for the one or more measurement samples. The derivation may be performed, for example, by an implementation based on the direct estimation unit 150 of FIG. 1, in which an optimization unit (or solver), such as the optimization 152 of FIG. 1, defines a cost function based on either the measured samples, or based on values/parameters that have been determined using other computation units. In FIG. 1, the motor control circuitry 120 determined the control signal $V_{\alpha\beta}$ based, in part, on earlier estimates of the position and speed of the electric motor, and those values/parameters may then be used by the optimization unit 152 to derive (through an optimization process that may be based on the measured current $i_{\alpha\beta}$ and/or its derivative) the present instantaneous estimates for the speed and position for the electric motor (which in turn are used to determine subsequent instances of the control signal $V_{\alpha\beta}$).

With continued reference to FIG. 6A, the procedure 600 additionally includes applying 630 a filtering operation to the derived instantaneous estimates to generate refined filtered values of the speed and position for the electric motor. Applying the filtering operation includes one or more of, for example, a) computing the filtered values of the speed and position for the electric motor using the derived instantaneous estimates in response to a determination that a computed convexity of the cost function around the derived instantaneous estimates is greater than or equal to a convexity threshold value, and/or b) applying a least-squares filtering operation, yielding the filtered values for the speed and position of the electric motor drive, according to the derived instantaneous estimates and using at least one set of previous estimates derived according to the optimization process applied to previous one or more measurement samples. Thus, the filtering may include either or both of a selective filter and a least-square filter (which may be realized as an FIR filter) that is applied to instantaneous estimates derived by the optimization unit (using a cost function defined or parametrized by such values as $i_{\alpha\beta}$, its derivative $\dot{i}_{\alpha\beta}$, and/or $V_{\alpha\beta}$). The selective filter (such as the selective filter 154 of FIG. 1) determines whether the estimates derived by the optimization process are of good enough quality (i.e., they are sufficiently robust, and thus less susceptible to noise or error), or of a poor quality (and thus should be discarded). In the latter case, if the just derived instantaneous estimate are deemed to be of poor quality, then a previously derived estimates for the motor's speed and position (derived by the optimization process using previous measurement samples) can be used for further processing (i.e., to generate, by the motor control circuitry, subsequent values of $V_{\alpha\beta}$). Thus, in such situations, the procedure 600 may include computing the filtered values of the speed and position for the electric motor using previous instantaneous estimates, derived based on previous one or more measurement samples for the electric motor drive, without using the presently derived instantaneous values, when the convexity of the cost function around the derived instantaneous estimates is below the convexity threshold value. It is to be noted that when the least squares filtering operation is used in conjunction with the selective filter, the least-squares filter will be applied to whichever estimates the selective filter selects as its present estimate (i.e., the freshly derived estimates, if the convexity of the cost function around the estimates exceeds or is equal to the convexity threshold, or previous estimates of the speed and position if the cost function's convexity around the derived estimates is less than the threshold). Thus, if the selective filter discards the presently derived estimates and uses previous estimates, the least-squares filter will be applied only to old, previously computed estimates (corresponding to previous instances for which measurements have been obtained). As noted, in some embodiments, the least-squares filter may be used without the selective filter being implemented or applied, in which case the least-squares filter will be applied to the present estimates derived by the optimization unit (e.g., whether or not the derived estimates are of good or bad quality as determined by the cost function's convexity) and to previously computed estimates.

In some embodiments, and as noted, applying the filtering operation to the derived instantaneous estimates may further include determining the filtered values for the speed and position values for the electric motor according to independent phase locked loop units (such as the units 510 and 520 shown in FIG. 5) applied according to estimates of the speed and position determined according to the optimization process based on the cost function defined for the one or more measurement samples. The dual-PLL filtering may be applied to the output of either the selective filter 152 or the least-squares filter 158 (the input to the least-squares filter 158 may be coupled either to the output of the optimization unit 152 or to the output of the selective filter 154).

In some examples, the procedure 600 may further include applying a perturbation input signal to the electric motor drive. The perturbation input signal may have a magnitude that decreases as rotational speed of the electric motor drive increases. In some embodiments, the perturbation signal maty include periodical portions of rising and falling sections approximating linear segments with slopes exceeding respective minimum slope thresholds required to increase robustness of a solution of the cost function for the one or more measurement samples to reduce variation of the solution for the cost function as a result of noise in the one or more measurement samples. For example, the periodical signal may include a triangular periodical signal with rising and falling slopes exceeding the respective minimum required slope thresholds.

Figure 6B:
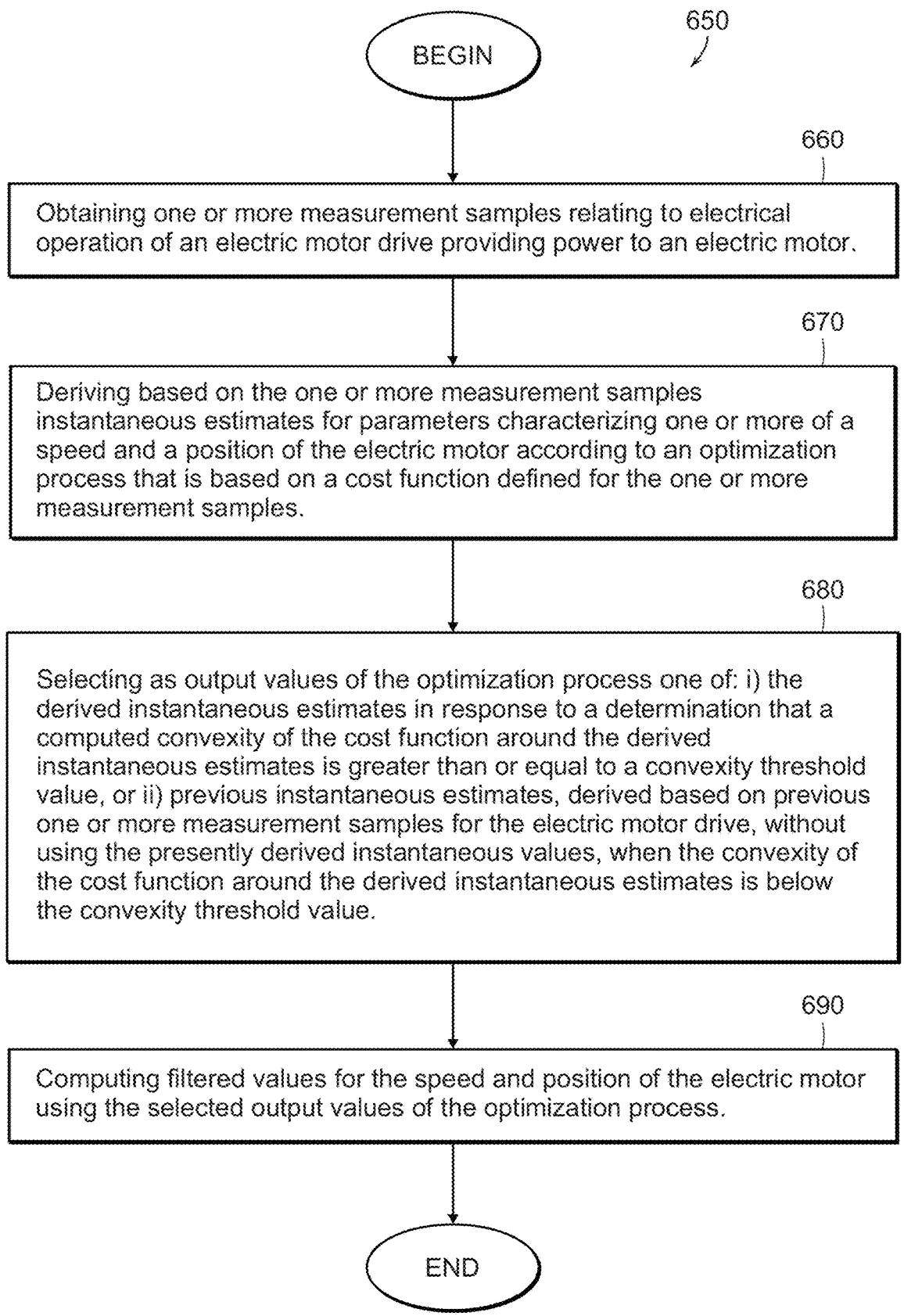
Figure 7A:
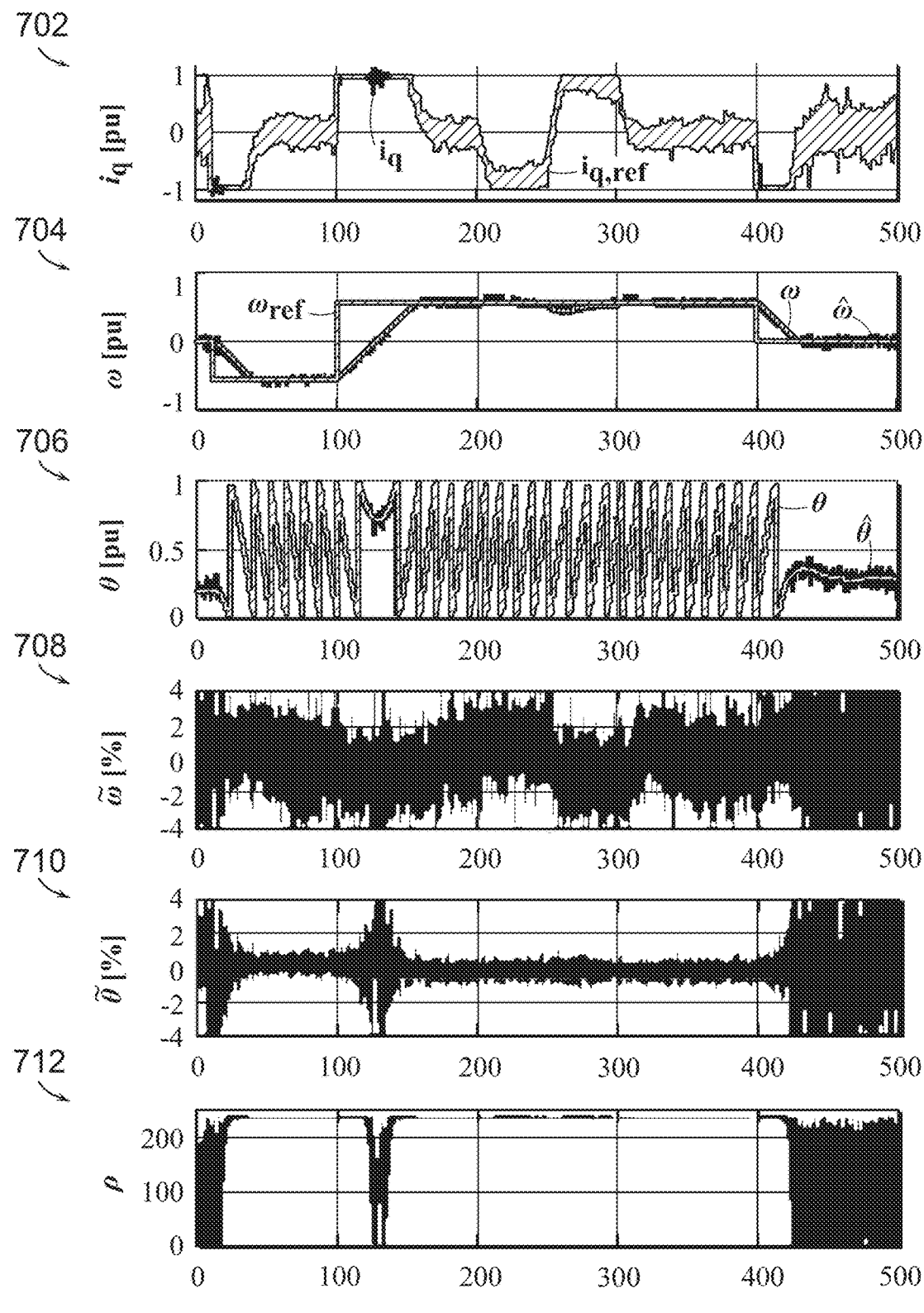
FIGS. 7a-f include graphs showing behavior of direct position and speed estimation for different filtering techniques.
Figure 7B:
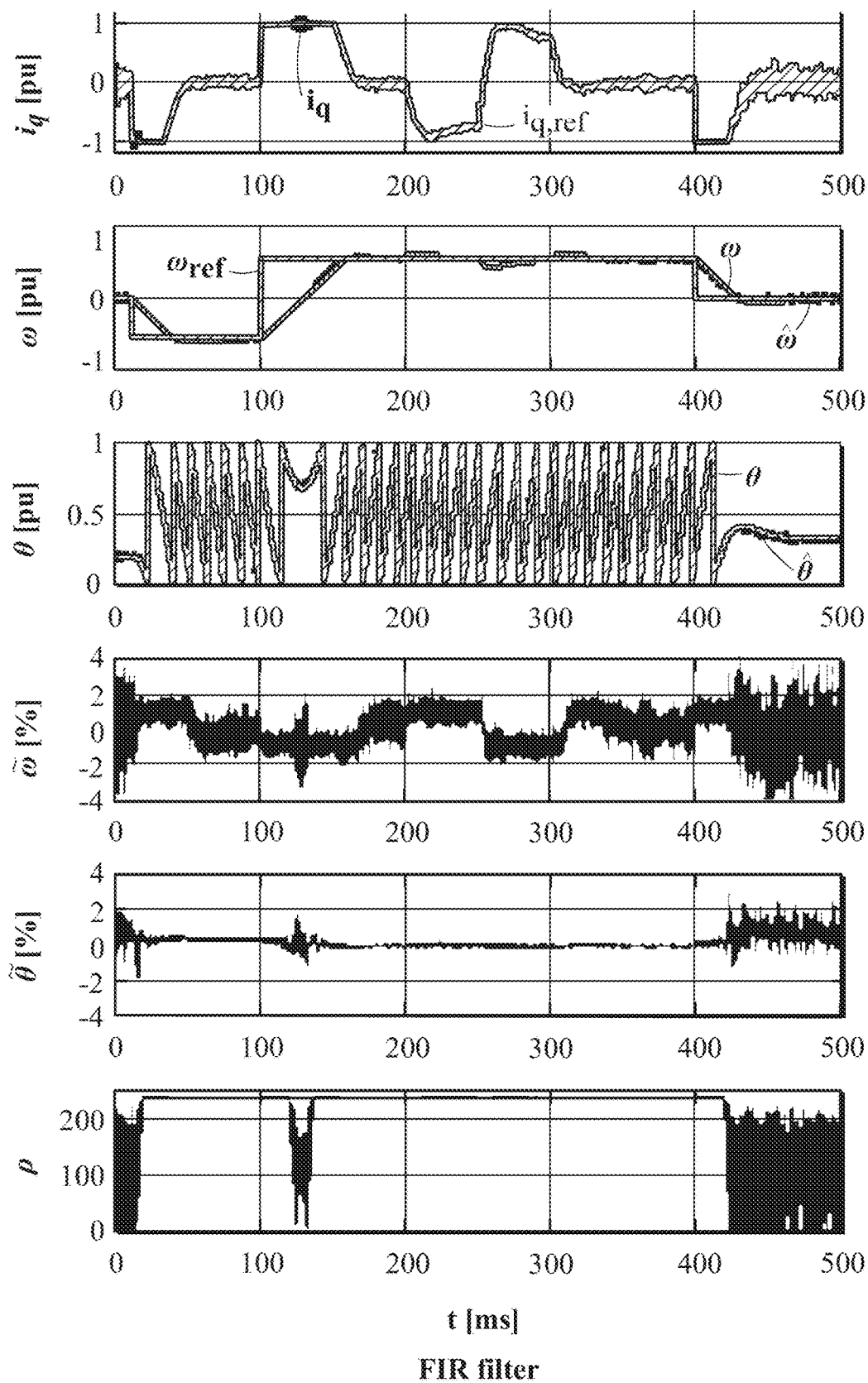
Figure 7C:
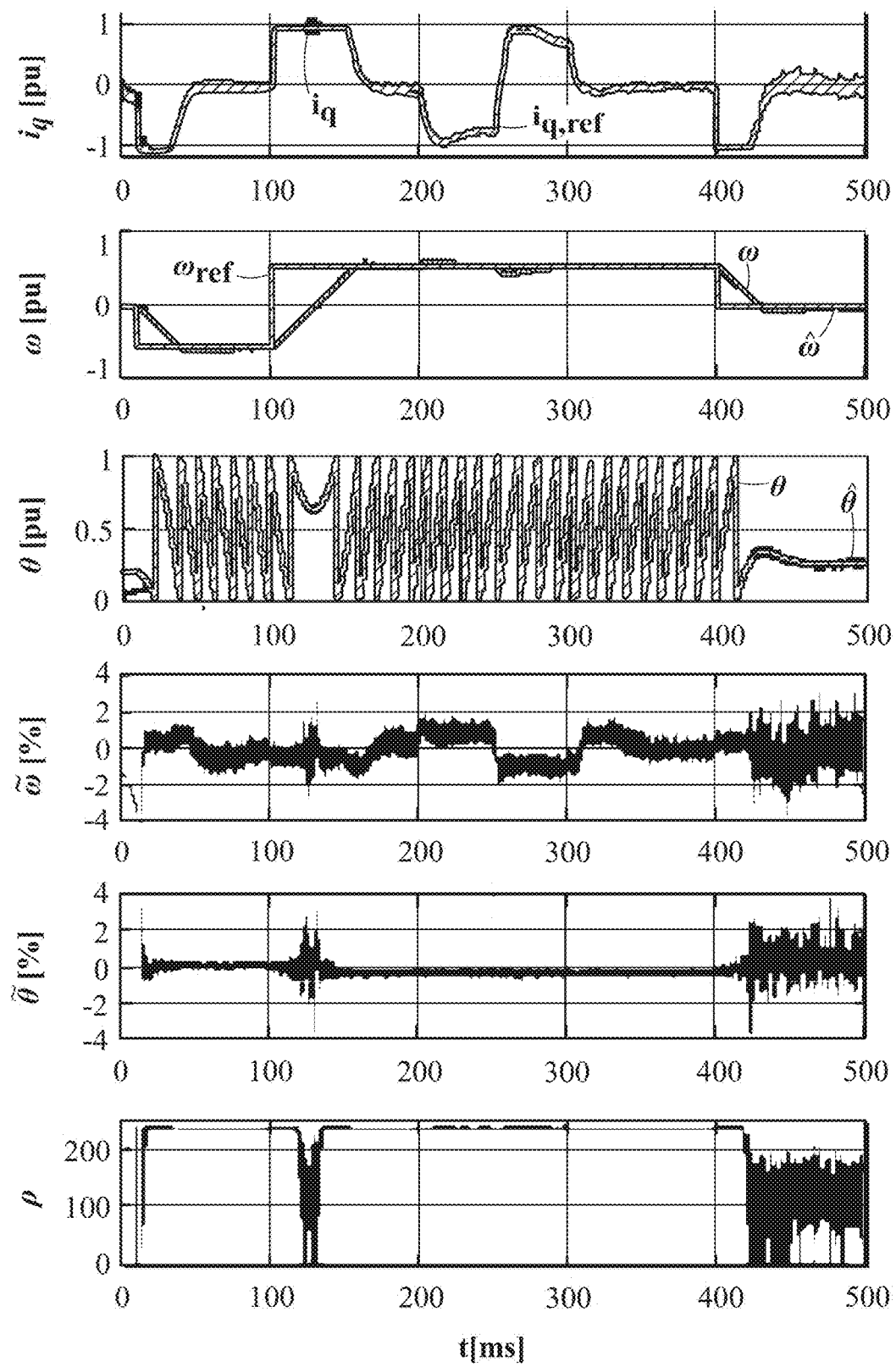
Figure 7D:
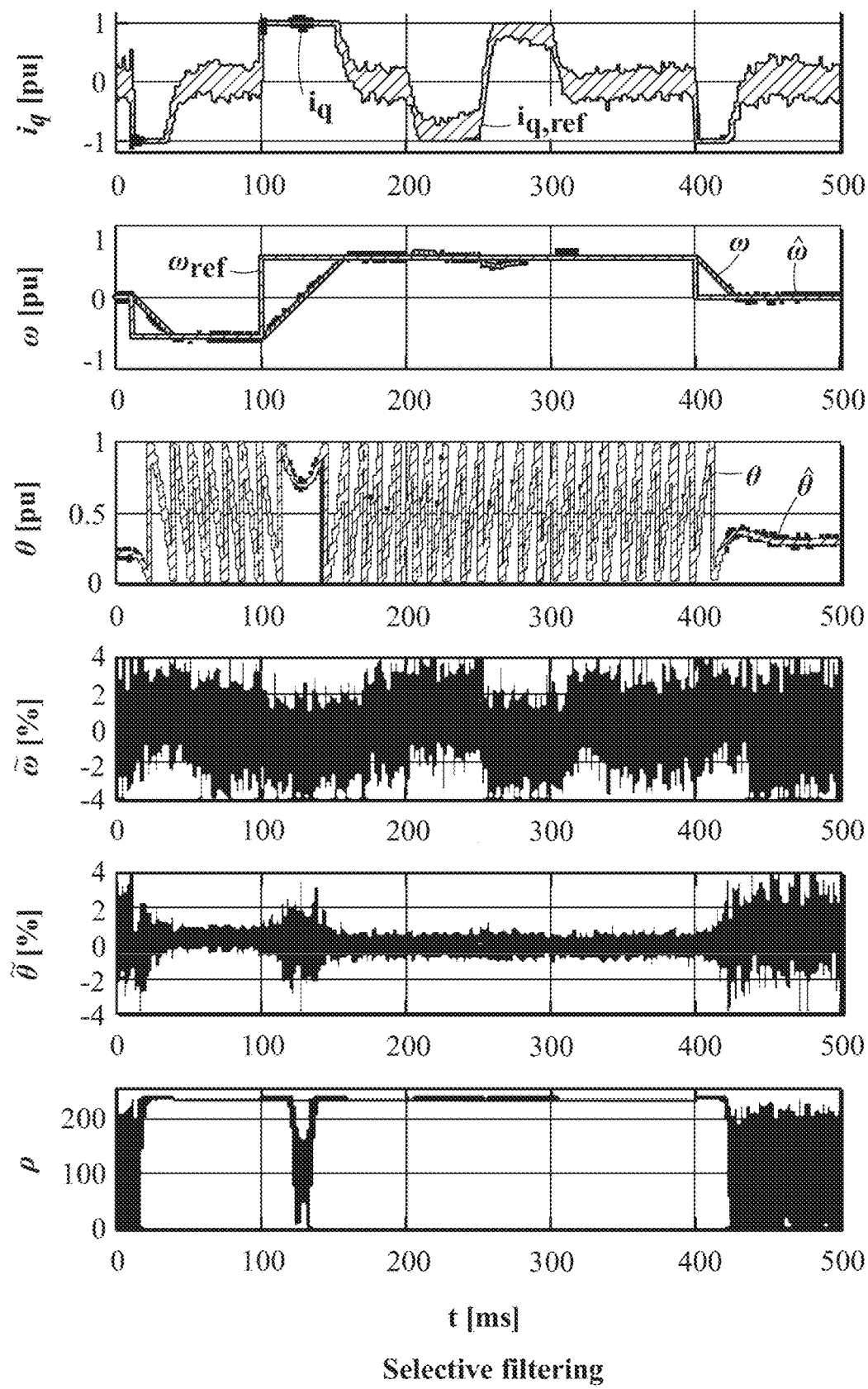
Figure 7E:
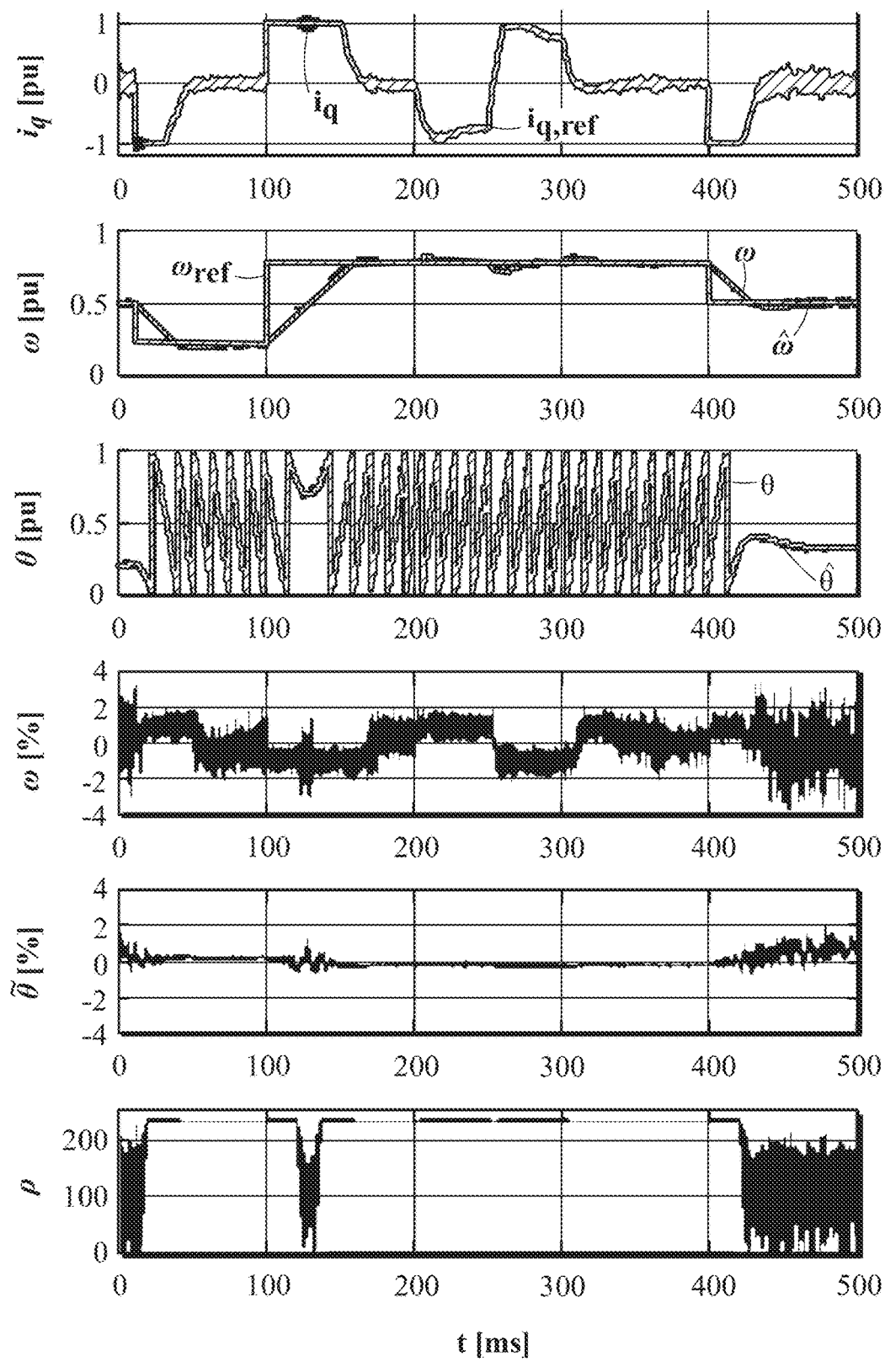
Figure 7F:
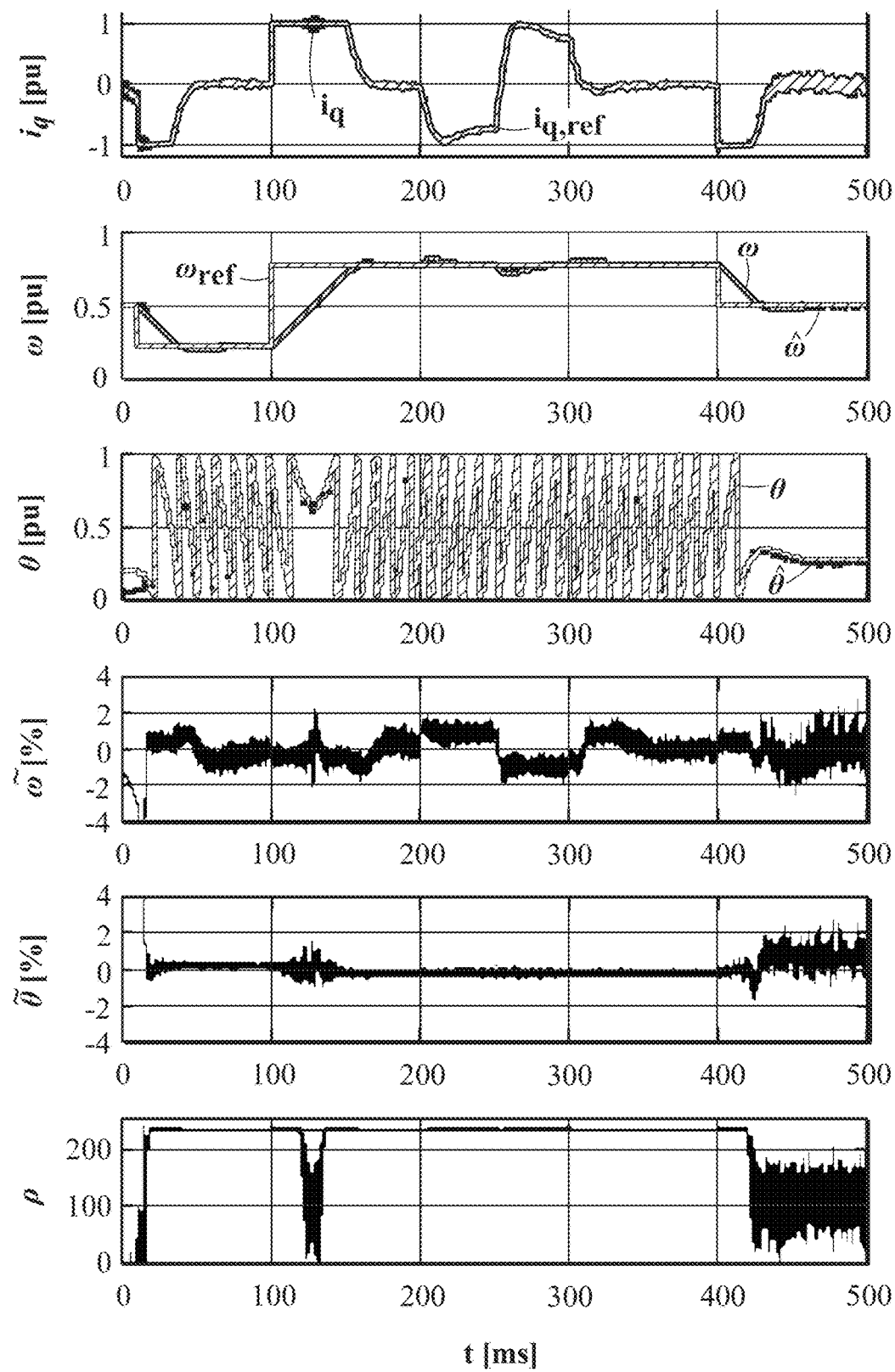

FIG. 6B is a flowchart of another example procedure 650 to determine speed and position estimates for a sensorless electric motor system, and to control an electric motor drive of the system. Some of the features and operations of the procedure 650 may be similar to the operations and features described in relation to FIG. 6A. In some examples, the procedure 650 includes obtaining 660 one or more measurement samples relating to electrical operation of an electric motor drive providing power to an electric motor, and deriving 670 based on the one or more measurement samples instantaneous estimates for parameters characterizing one or more of a speed and a position of the electric motor according to an optimization process that is based on a cost function defined for the one or more measurement samples. The operations 660 and 670, may be similar to those of operations 610 and 620 of FIG. 6A.

The procedure 650 further includes selecting 680 as output values of the optimization process one of: i) the derived instantaneous estimates in response to a determination that a computed convexity of the cost function around the derived instantaneous estimates is greater than or equal to a convexity threshold value, or ii) previous instantaneous estimates, derived based on previous one or more measurement samples for the electric motor drive, without using the presently derived instantaneous values, when the convexity of the cost function around the derived instantaneous estimates is below the convexity threshold value. Thus, in such examples, the procedure 650 applies a selective filter (such as the filter 154 of FIG. 1) to determine the output of the optimization process (implemented, for example, using the solver/optimization unit 152). The output can be either the presently derived estimates, or, if the computed convexity of the cost function at the presently derived estimates is below a pre-determined convexity threshold (reference value), the previous estimates (computed at an earlier time instance) may be used as the output of the optimization process (e.g., if the convexity of the cost function used to derived those earlier estimates was equal to or greater than the threshold convexity value at around those derived estimates).

Continuing with FIG. 6B, the procedure 650 includes computing 690 filtered values for the speed and position of the electric motor using the selected output values of the optimization process. In some embodiments, the output of the selective filter may be the finalized filtered values for the speed and position estimated of the electric motor (i.e., no additional output filtering is performed on the output of the optimization process). Alternatively, in some embodiments, additional filtering processing may be performed on the output of the selective filter. Thus, in some examples, the procedure 650 may further include applying a least-squares filtering operation to the output values of the optimization process, yielding the filtered values for the speed and position of the electric motor, according to the derived instantaneous estimates and using at least one set of previous estimates derived according to the optimization process applied to previous one or more measurement samples. In some situations, the procedure 650 may further include determining the filtered values for the speed and position values for the electric motor according to independent phase locked loop units applied to estimates of the speed and position (determined according to the optimization process, e.g., based on the cost function defined for the one or more measurement samples).

To improve robustness of the derived estimates, in some embodiments, the procedure 650 may additionally include applying a perturbation input signal to the electric motor drive. For example, a triangular perturbation signal, with slopes satisfying pre-determined criteria, may be injected into the electric motor drive control signaling.

Performing the various techniques and operations described herein may be facilitated by a controller system, such as a processor-based computing system (e.g., to perform the optimization process, perform the filtering operations, etc., of some the approaches described herein). Such a computing system may include a processor-based device such as a personal computer, a specialized computing device, and so forth, that typically includes a central processor unit or a processing core. In addition to the CPU, the system may include main memory, cache memory and bus interface circuits. The processor-based device may include a mass storage element, such as a hard drive (solid state hard drive, or other types of hard drive), or flash drive associated with the computer system. The computing system may further include a keyboard, or keypad, or some other user input interface, and a monitor, e.g., an LCD (liquid crystal display) monitor, that may be placed where a user can access them.

The processor-based device is configured to facilitate, for example, the implementation of high performance selective and output filter techniques for sensorless direct position and speed estimation. The storage device may thus include a computer program product that when executed on the processor-based device causes the processor-based device to perform operations to facilitate the implementation of procedures and operations described herein. The processor-based device may further include peripheral devices to enable input/output functionality. Such peripheral devices may include, for example, a CD-ROM drive and/or flash drive (e.g., a removable flash drive), or a network connection (e.g., implemented using a USB port and/or a wireless transceiver), for downloading related content to the connected system. Such peripheral devices may also be used for downloading software containing computer instructions to enable general operation of the respective system/device. Alternatively and/or additionally, in some embodiments, special purpose logic circuitry, e.g., an FPGA (field programmable gate array), an ASIC (application-specific integrated circuit), a DSP processor, etc., may be used in the implementation of the computing system. Other modules that may be included with the processor-based device are speakers, a sound card, a pointing device, e.g., a mouse or a trackball, by which the user can provide input to the computing system. The processor-based device may include an operating system, e.g., Windows XP® Microsoft Corporation operating system, Ubuntu operating system, etc.

Computer programs (also known as programs, software, software applications or code) include machine instructions for a programmable processor, and may be implemented in a high-level procedural and/or object-oriented programming language, and/or in assembly/machine language. As used herein, the term "machine-readable medium" refers to any non-transitory computer program product, apparatus and/or device (e.g., magnetic discs, optical disks, memory, Programmable Logic Devices (PLDs)) used to provide machine instructions and/or data to a programmable processor, including a non-transitory machine-readable medium that receives machine instructions as a machine-readable signal.

In some embodiments, any suitable computer readable media can be used for storing instructions for performing the processes/operations/procedures described herein. For example, in some embodiments computer readable media can be transitory or non-transitory. For example, non-transitory computer readable media can include media such as magnetic media (such as hard disks, floppy disks, etc.), optical media (such as compact discs, digital video discs, Blu-ray discs, etc.), semiconductor media (such as flash memory, electrically programmable read only memory (EPROM), electrically erasable programmable read only Memory (EEPROM), etc.), any suitable media that is not fleeting or not devoid of any semblance of permanence during transmission, and/or any suitable tangible media. As another example, transitory computer readable media can include signals on networks, in wires, conductors, optical fibers, circuits, any suitable media that is fleeting and devoid of any semblance of permanence during transmission, and/or any suitable intangible media.

In some implementations, a computer accessible non-transitory storage medium includes a database (also referred to as a "design structure" or "integrated circuit definition dataset") representative of a system/architecture including some or all of the components of the control circuitry for an electric-motor-based system, including, for example, circuitry configured to determine speed and position estimates for a rotor of an electric motor, and to generate the control and driving signals to drive the electric motor, as more particularly described herein.. In general, a computer accessible storage medium may include any non-transitory storage media accessible by a computer during use to provide instructions and/or data to the computer. For example, a computer accessible storage medium may include storage media such as magnetic or optical disks and semiconductor memories. Generally, the database representative of the system may be a database or other data structure which can be read by a program and used, directly or indirectly, to fabricate the hardware comprising the system. For example, the database may be a behavioral-level description or register-transfer level (RTL) description of the hardware functionality in a high-level design language (HDL) such as Verilog or VHDL, or some other language. The description may be read by a synthesis tool which may synthesize the description to produce a netlist comprising a list of gates from a synthesis library. The netlist comprises a set of gates which also represents the functionality of the hardware comprising the system. The netlist may then be placed and routed to produce a data set describing geometric shapes to be applied to masks. The masks may then be used in various semiconductor fabrication steps to produce a semiconductor circuit or circuits corresponding to the system. In other examples, the database may itself be the netlist (with or without the synthesis library) or the data set.

To test and evaluate the performance of some of the implementations described herein, several studies, simulations, and experiments were conducted. A permanent magnet synchronous machine (PMSM) testbench was implemented with the following parameters for the control and inverter stage (i.e., the motor drive):

a) DC voltage vc=800V;
b) PWM switching period Tsw=100 μs;
c) Sampling period Ts=50 μs;
d) Interlock time Ti=0.3 μs; and
e) Typical current sensor noise Iw≈0.5%.

The microcontroller used was 200 MHz TI C2000 Delfino processor. The electric motor used had the following attributes:

a) Base speed $\Omega$=1800 rpm;
b) Rated torque Tr=29.7 Nm;
c) Pole pairs p=5;
d) Rated current Ir=10 A;
e) Rated d-axis inductance Ld=10.5 mH;
f) Rated q-axis inductance Lq=12.9 mH;
g) Rated PM flux $\psi$=349.1 mWb; and
h) Rated stator resistance R=0.4$\Omega$ Some of the dynamic performance study results were obtained with a software-in-the-loop (SiL) platform, since that dynamic performance study requires an excessive transient load torque, which exceeded the capabilities of the available lab equipment by a factor 10-100 (in bandwidth and magnitude). Instead, the SiL platform executed the code used by the control and inverter stage circuitry for direct estimation and control, but replaced the physical test-bench with a high-fidelity model of the inverter (modeling on-voltage drops and dead-times) and motor (using flux-current maps that capture saturation and cross-saturation). Both, the experimental and SiL platform used peak and valley sampling such that the sampling frequency was twice the switching frequency.

In the experimentations and testing conducted herein, results were obtained using PWM vector control with 1 kHz bandwidth. To prevent direct estimation issues at standstill, a rotating voltage perturbation was injected at low speeds. The frequency was chosen to be 5 kHz, i.e. 5 times the bandwidth of the current controller to prevent any undesired coupling. The injection magnitude is chosen to be 120V, i.e., 15% of the dc voltage, at standstill. Increasing the speed |ω|, the injection magnitude was scaled down linearly to zero, with no voltage perturbation applied above 270 rpm (absolute speed), i.e., 15% of the rated speed. This perturbation was chosen as a compromise between power losses and robustness based on those illustrated in FIG. 2. Furthermore, all results were obtained without compensating voltage drops $\Delta v_{\alpha\beta}$ in control or estimation to provide a worst-case baseline that can be improved with any compensation technique.

With reference to FIG. 7, graphs showing the behavior of direct position and speed estimation are provided, where the speed estimate is used for speed control of the machine and the position estimate is used in the inner vector (current) control loop for the Park transformation. The machine follows a speed reference profile with positive and negative speed steps, speed reversal, and finally a step to standstill, where the machine is held. A positive and negative load torque step was applied to illustrate the capability of the speed loop to reject disturbances. The test procedure was used to show the behavior of direct estimation without output filtering (FIG. 7a), with an FIR filter (in FIG. 7b), and with dual-PLL filtering (in FIG. 7c). Furthermore, the behavior of selective filtering is illustrated without output filtering (in FIG. 7d), with FIR filter (FIG. 7e), and with dual-PLL (FIG. 7f). For each test, the following graphs are provided: i) the reference and measured q-axis current (the d-axis current is controlled and remains at zero) at the top graph (e.g., graph 702 in FIG. 7a), ii) the estimated, measured, and reference speed at the second graph from the top (e.g., graph 704 in FIG. 7a), iii) the estimated and measured position in the third graph from the top (e.g., graph 706 in FIG. 7a), iv) the speed error in the fourth graph from the top (e.g., graph 708 in FIG. 7a), v) the position error in the fifth graph from the top (e.g., graph 710), and vi) the robustness factor ρ (higher means better rejection of disturbances) in the bottom most graph (e.g., graph 712 in FIG. 7a).

As discussed, the direct estimation does not require an output filter and the resulting estimates may be acceptable for some applications. However, the estimates can be noisy since direct estimation issues an independent position and speed estimate at each sampling instant. The error is higher at low speed where the robustness factor tends to be lower (at times it can be zero) and voltage disturbances, e.g., dead-times, or modeling errors result in increased estimation errors. The samples with low robustness factor are removed by selective filtering, thus reducing peak estimation errors, which is especially noticeable in the position error. Both approaches can be combined with FIR and dual-PLL filtering. The least-squares results (also referred to as the FIR results herein, although other filter types may be used) are reported using N=10 samples for filtering. The dual-PLL was tuned to the highest stable bandwidth on the test-bench, which corresponded to 1 kHz. In comparison, the FIR filter resulted in a cleaner position estimate but increased speed estimation noise (while achieving a higher bandwidth).

Figure 8A:
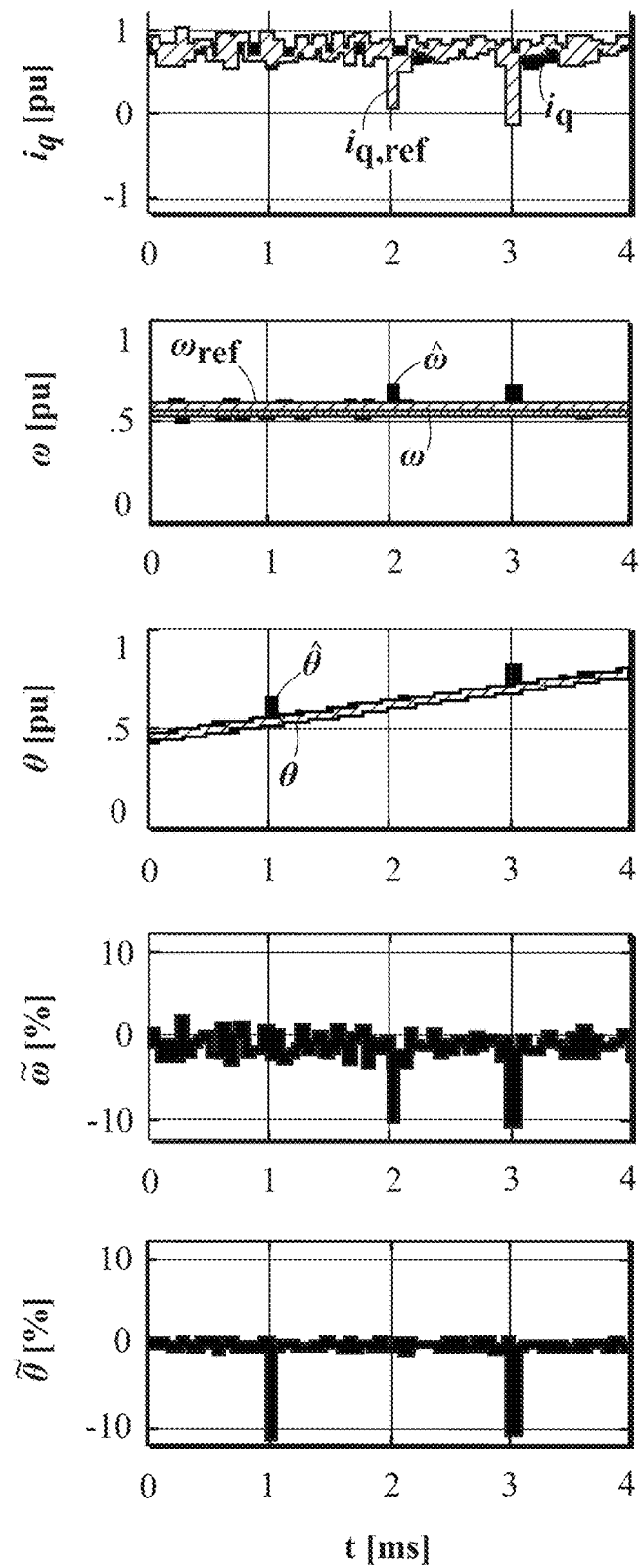
FIGS. 8a-c are graphs showing results for convergence of direct position and speed estimation using different filtering operations/configurations.
Figure 8B:
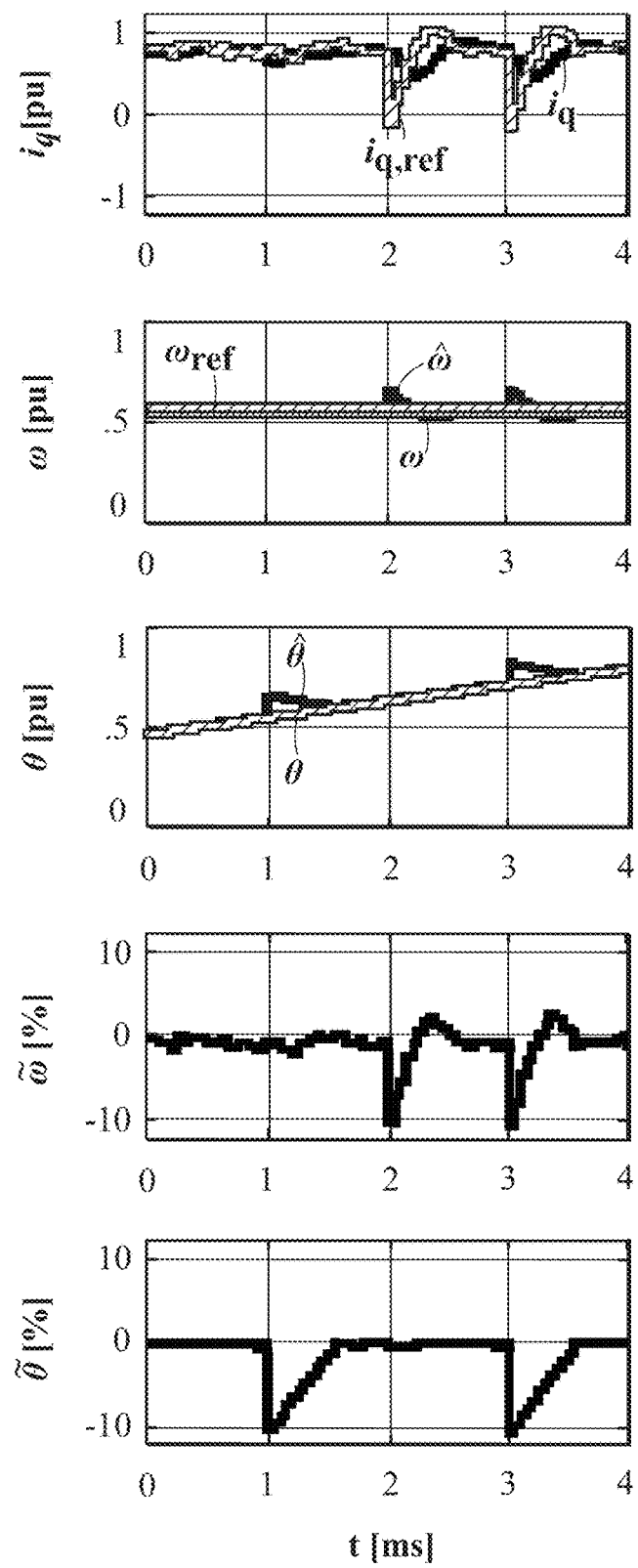
Figure 8C:
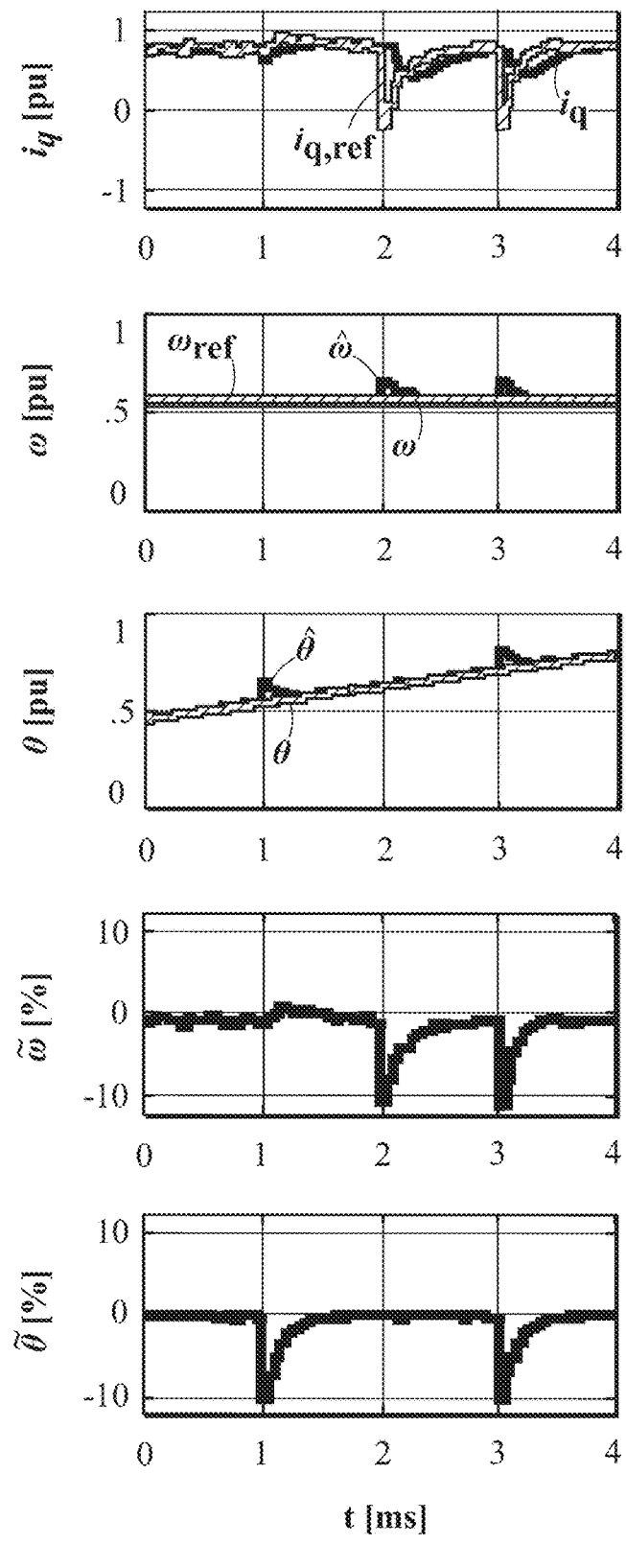

The dynamic performance of direct estimation with output filters was evaluated by setting the estimator (and filters) to an erroneous estimate and measuring the convergence times to the correct values. FIG. 8a shows experimental results for convergence of direct position and speed estimation using selective filtering with $\rho_{min}$=50 when no other filter was used (i.e., without the output filter 156 of FIG. 1), FIG. 8b shows the experimental results for convergence of direct position and speed estimation using an FIR filter with N=10, and FIG. 8c shows experimental results for convergence of direct position and speed estimation when a dual-PLL filter with 1 kHz was used. It is noted that the graphs of FIGS. 8b-c were generated by having the FIR and dual-PLL used in conjunction with the selective filter (i.e., a selective filter was applied upstream from the FIR or dual-PLL in the implementations used for obtaining the test results shown in FIGS. 8b-c). Each of FIGS. 8a-c traces graphs (top to bottom) showing: i) measured $i_q$ and reference $i_{q,ref}$ current, ii) measured ω, estimated $\hat{\omega}$, and the reference speed $\omega_{ref\,speed}$, iii) measured θ and the estimated $\hat{\theta}$ position, iv) speed error $\tilde{\omega}$, and position error $\tilde{\theta}$. The graphs show convergence from a 10% position estimation error at t=1 ms, 10% speed estimation error at t=2 ms, and 10% position and speed estimation error t=3 ms. The tests were used to evaluate the practical bandwidth pbw=0.34/$t_r$, where $t_r$ was the 10% to 90% rise time. It is observed that without output filtering, direct estimation corrects a position or speed error within one sample, which corresponds to 6.8 kHz practical bandwidth on the test system with 20 kHz sampling frequency. The output filters reduce the noise on the estimates at the expense of dynamic performance. On position errors, the FIR filter has a $t_r$ of 8 samples, which results in 0.85 kHz practical bandwidth. This behavior is expected since the FIR filter converges linearly by design (at constant speed) and must replace 80% of the N internally stored "erroneous" samples to reduce the error by 80%. The dual-PLL filter has a $t_r$ of 7 samples, which results in 0.97 kHz. This result corresponds to the design bandwidth of 1 kHz and the filter has the expected exponential decay of a first-order filter. On speed errors, the FIR filter has a $t_r$ of 3 samples, which results in 2.3 kHz practical bandwidth. In this case, the FIR filter is faster as it fits both the position and speed estimates, and a speed sequence with offset does not fit the expected position increment. In contrast, the dual-PLL filter relies predominantly on the speed estimate and has a $t_r$ of 7-8 samples, which results in 0.85 kHz-0.97 kHz. Both filters behave similarly when a position and speed error occur simultaneously. It is noted that the practical bandwidth of the FIR filter can be increased by decreasing N, where N=0 corresponds to a pass-through without filtering. On the other hand, increasing the bandwidth of the dual-PLL filter results in stability issues.

Figure 9:
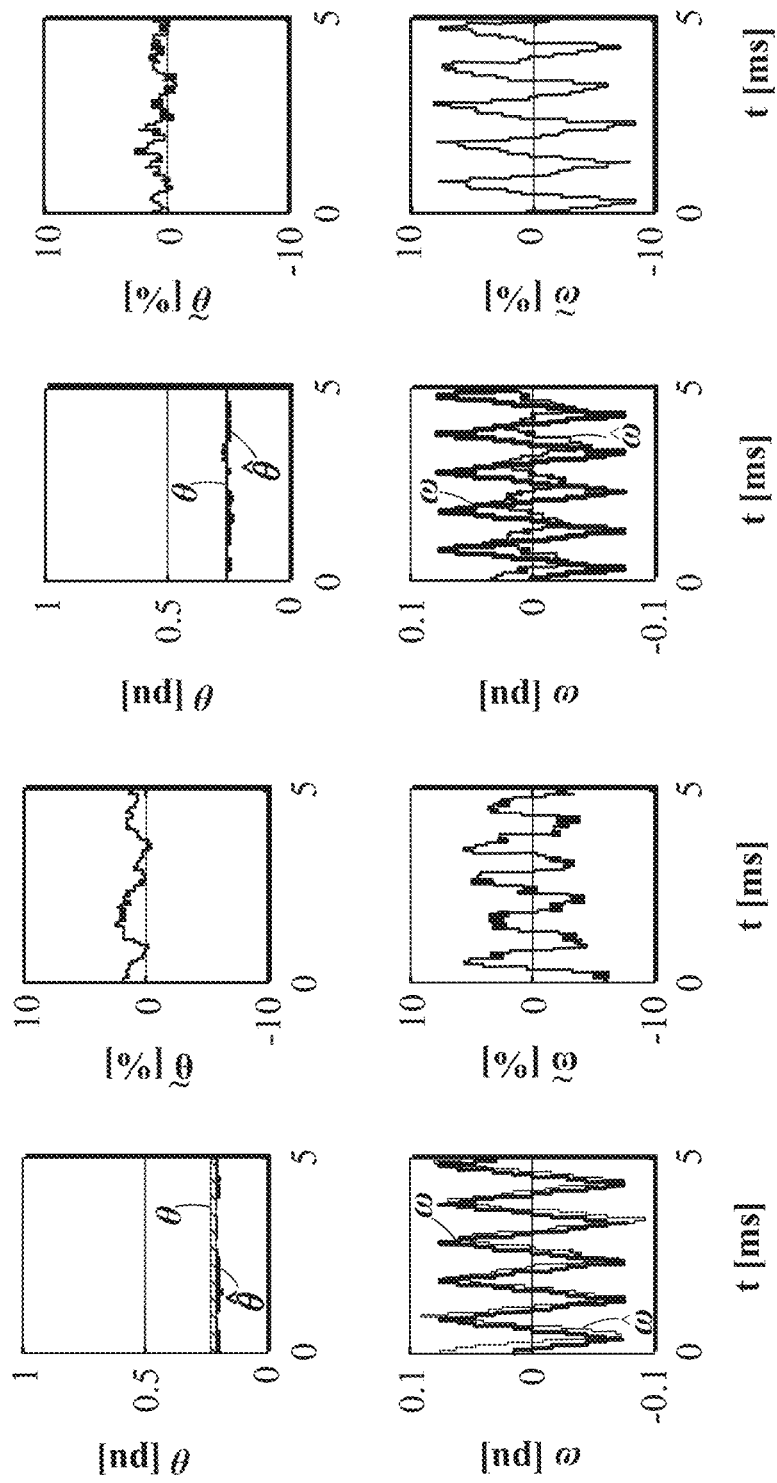
FIG. 9 includes graphs showing performance results, computed on the SiL platform, for direct estimation of speed and position for a large load torque signal.

As a second test, the dynamic performance of direct estimation was evaluated by applying an excessive (400 Nm) transient (1 kHz) load torque signal, which exceeds the induction-machine dyno capabilities by a factor 10 in magnitude and bandwidth. Hence, the results presented in FIG. 9 were obtained on the SiL platform. The load torque was applied to achieve a ±10% 1 kHz speed variation at zero speed, where the estimation robustness tends to be low. The tests were performed using selective filtering combined with FIR filter and dual-PLL. In direct comparison, the FIR filter traces the high-frequency speed signal significantly better. In fact, it achieves more than twice the speed estimation bandwidth (with N=10), which can be further increased (while achieving a similar filter performance). This test was performed since speed estimation bandwidth has a high priority in many practical applications. The speed signal is the measured, i.e., estimated, input of the speed control loop, which is a common configuration and may require high bandwidths (especially if an external, cascaded position loop is used). Furthermore, a high bandwidth speed signal can provide useful information on the load torque dynamics or torque ripples.

Figure 10:
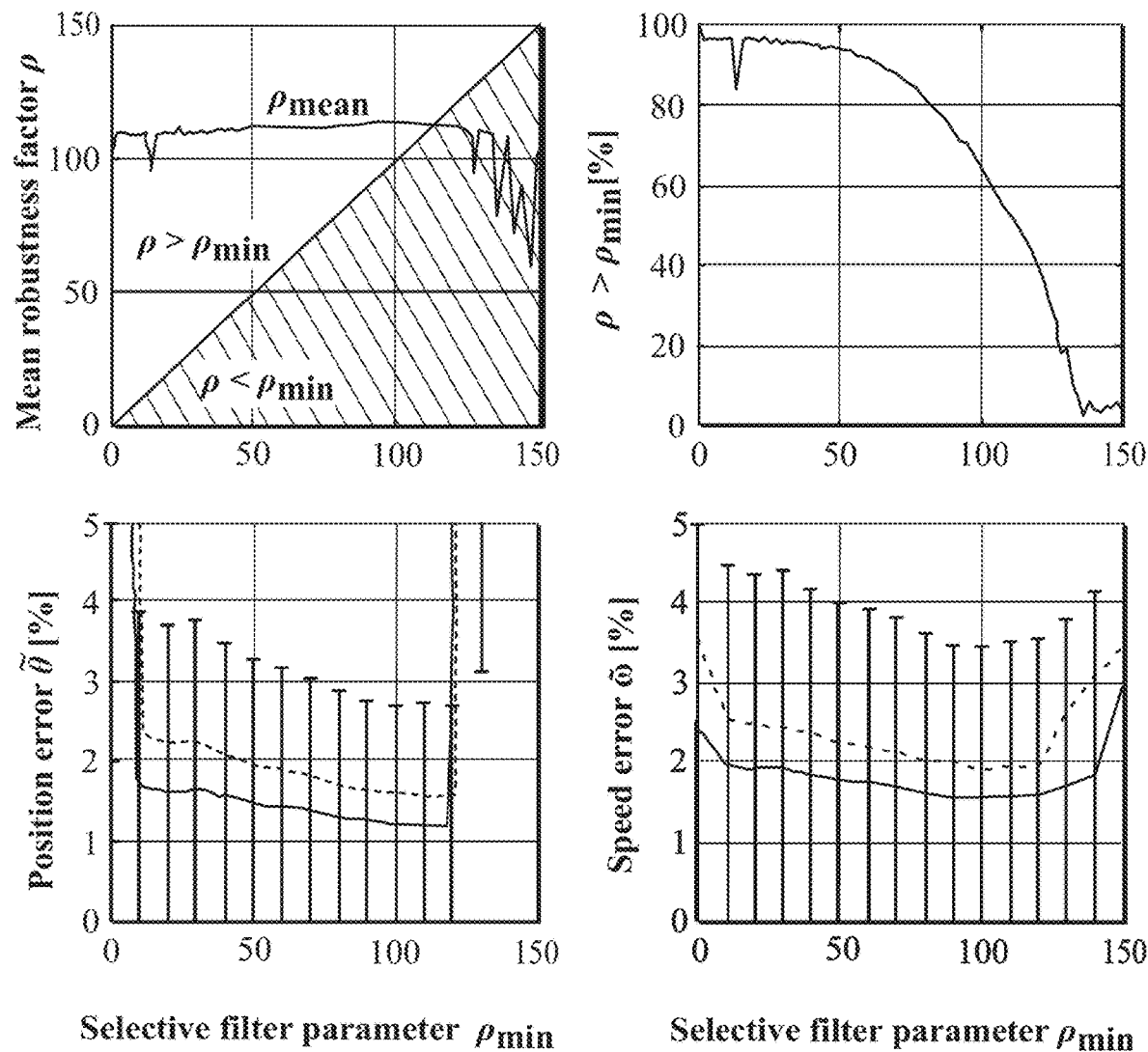
FIG. 10 are graphs presenting performance results for selective filtering behavior used in the implementation described herein.

The selective filter performance was evaluated at zero speed (where the robustness factor ρ tends to be low). FIG. 10 presents the results for multiple runs plotted with respect to the minimum robustness factor $\rho_{min}$. Thus, the direct estimation algorithm does not issue a new estimate when $\rho<\rho_{min}$ but extrapolates the measurement from the previous sampling instant. A small $\rho_{min}$ improves the mean, worst-case, and rms position and speed estimation error considerably compared to $\rho_{min}$=0. Increasing $\rho_{min}$ reduces the errors marginally. However once $\rho_{min}$ is larger than the mean ρ value, the estimation process deteriorates quickly since most of the samples are discarded. Finally, it is noted that the computational overhead of selective filtering is generally a non-issue. Direct estimation uses, in some embodiments, a Newton method for identifying the estimates. Therefore, it exposes the 2×2 Hessian of the cost function, which is needed in the Newton step. Numerical instabilities are prevented using an eigenvalue check, which is trivial for a matrix of this size. Upon convergence, the solver (e.g., the optimization unit 152 of FIG. 1) can simply check the resulting ρ and discard the estimate if needed. These checks can be performed in less than 10 ns.

Figure 11:
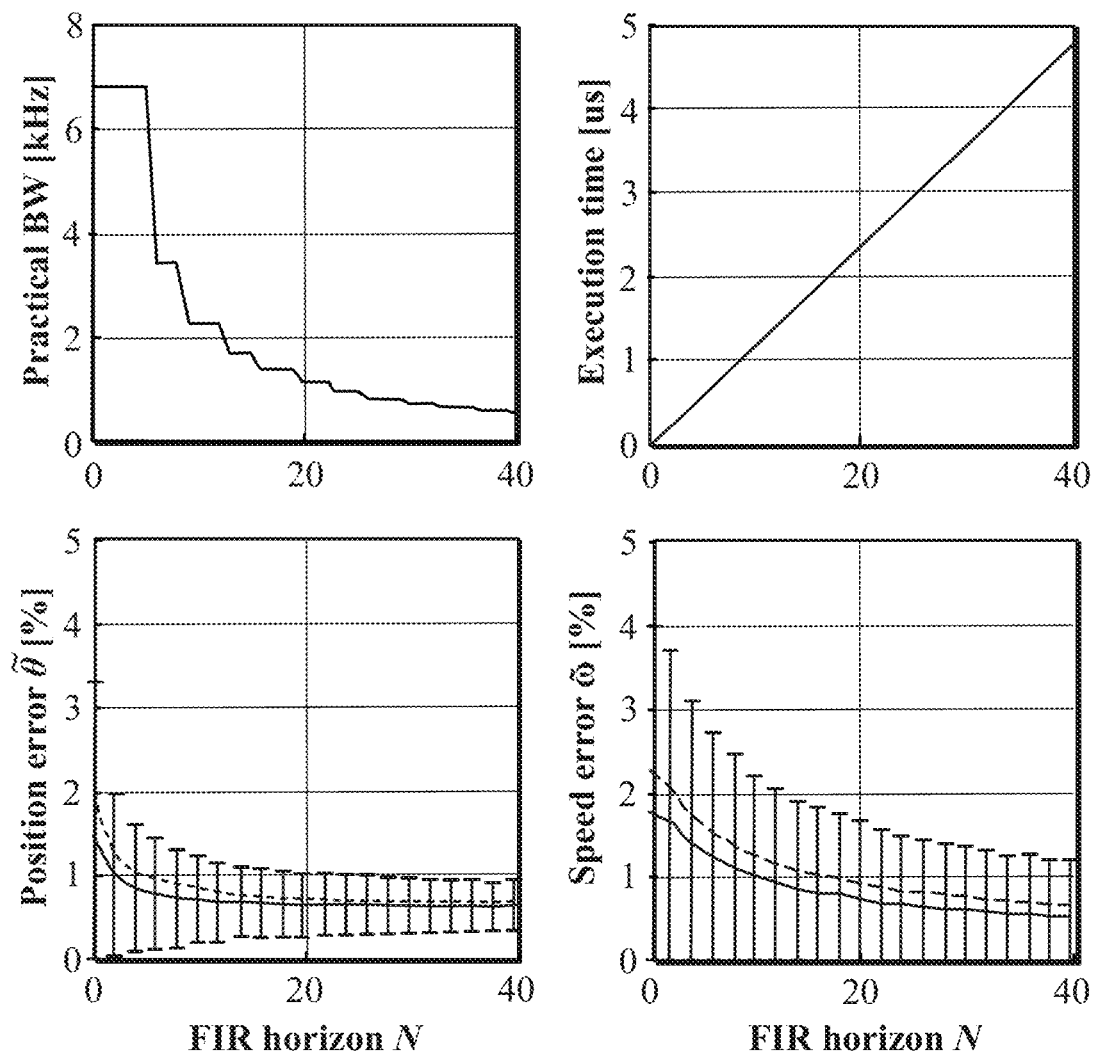
FIG. 11 are graphs presenting performance results for FIR filtering behavior used in the implementation described herein.

The least-squares (FIR) filter performance was evaluated at zero speed (where the estimation noise tends to be high). FIG. 11 presents the results for multiple runs plotted with respect to the number of samples N that were used for filtering. As expected, increasing the number of samples improved the mean, worst-case, and rms position and speed estimation error. Initially the increase is significant, and the estimation errors are approximately halved at N=10 (compared to N=0). However, the improvements tend to level out at high N. This behavior is expected since output filters are effective in removing noise. The remaining offset, which may result from modeling errors, was found to be <1%. Increasing the filtering performance, i.e., N, is expected to reduce the filter dynamics, i.e., bandwidth. This behavior is quantified using the concept of practical bandwidth $pbw=0.34/t_r$, where $t_r$ is the 10% to 90% rise time. An estimation offset is introduced and the "rise time" is measured until the estimate falls below 10% of the initial error. The maximum achievable pbw is 6.8 kHz since direct estimation without output filter (N=0) requires at least 1 sample (50 µs) to reach the estimate. The pbw remains at 6.8 kHz for N∈[0, 5], 4.3 kHz for N∈[6, 8], 2.3 kHz for N=[9, 12]. By comparison the dual-PLL is unstable at frequencies exceeding 1 kHz on the test-bench configuration used. Tuned to 1 kHz, it achieves estimates with a similar noise compared to the FIR filter with N=10 and more than double the bandwidth. Finally, the computation complexity of the DIR filter increases linearly with N. However, typical values, e.g. up to N=20, remain trivial to execute on typical motor drive microcontrollers.

Although particular embodiments have been disclosed herein in detail, this has been done by way of example for purposes of illustration only, and is not intended to be limiting with respect to the scope of the appended claims, which follow. Features of the disclosed embodiments can be combined, rearranged, etc., within the scope of the invention to produce more embodiments. Some other aspects, advantages, and modifications are considered to be within the scope of the claims provided below. The claims presented are representative of at least some of the embodiments and features disclosed herein. Other unclaimed embodiments and features are also contemplated.

What is claimed is:

1. A method comprising:
   obtaining one or more measurement samples relating to electrical operation of an electric motor drive providing power to an electric motor;
   deriving, based on a cost function associated with a state space model and on the one or more measurement samples, a present estimate for a parameter characterizing the electric motor, wherein the parameter is motor speed;
   determining an estimate for the parameter characterizing the electric motor by applying a filtering operation to the derived present estimate and a previous estimate for the parameter derived based on the cost function and previous one or more measurement samples;
   deriving, based on the cost function associated with the state space model and on the one or more measurement samples, a second present estimate for motor position; and
   determining a second estimate for the motor position by applying the filtering operation to the derived second present estimate and a previous second estimate for the motor position derived based on the cost function and the previous one or more measurement samples,
   wherein determining the estimate for the motor speed and the second estimate for the motor position further includes:
   applying an output filter that includes a dual phase locked loop tracking operation including a speed estimation phase locked loop and a position estimation phase locked loop.

2. The method of claim 1, wherein deriving, based on the cost function associated with a state space model and on the one or more measurement samples, the present estimate includes:
   executing an optimization process that includes iteratively solving the cost function and evaluating solutions of the cost function using a convergence criterion.

3. The method of claim 1, wherein determining the estimate for the parameter by applying the filtering operation includes:
   applying a selective filter as the filtering operation to select one of: i) the derived present estimate for the parameter, or ii) the previous estimate for the parameter.

4. The method of claim 1, wherein determining the estimate for the parameter by applying the filtering operation includes:
   applying a least-squares filtering operation to the derived present estimate and the previous estimate to generate the estimate.

5. The method of claim 1, further comprising:
   controlling, by the electric motor drive, operation of the electric motor based on the estimate for the parameter.

6. The method of claim 1, wherein obtaining the one or more measurement samples includes: obtaining one or more of: controlled current provided to the electric motor by the motor drive, a derivative of the controlled current, or a control signal provided as input to the electric motor drive.

7. The method of claim 1, further comprising: applying a perturbation input signal to the electric motor drive, wherein the perturbation input signal is a periodic signal with at least one linear slope segment.

8. The method of claim 7, wherein the perturbation input signal is a triangular periodical signal.

9. A system comprising:
   an electric motor drive configured to be electrically coupled to an electric motor and to provide power to the electric motor;
   a sensor configured to output one or more measurement samples relating to electrical operation of the electric motor drive; and
   a controller coupled to the electric motor drive and to the sensor, and including an electronic processor, the controller configured to:
   obtain the one or more measurement samples relating to electrical operation of the electric motor drive; and
   derive, based on a cost function associated with a state space model and on the one or more measurement samples, a present estimate for a parameter characterizing the electric motor, wherein to derive the present estimate based on the cost function associated with the state space model and on the one or more measurement samples, the controller is configured to: solve the cost function using a real-time solver; and
   determine an estimate for the parameter characterizing the electric motor by applying a filtering operation to the derived present estimate and a previous estimate for the parameter derived based on the cost function and previous one or more measurement samples.

10. The system of claim 9, wherein to derive the present estimate based on the cost function associated with the state space model and on the one or more measurement samples, the controller is configured to:
  execute an optimization process that includes iteratively solving the cost function and evaluating solutions of the cost function using a convergence criterion.

11. The system of claim 9, wherein to determine the estimate for the parameter by applying the filtering operation, the controller is configured to:
  apply a least-squares filtering operation to the derived present estimate and the previous estimate to generate the estimate.

12. A system comprising:
an electric motor drive configured to be electrically coupled to an electric motor and to provide power to the electric motor;
a sensor configured to output one or more measurement samples relating to electrical operation of the electric motor drive; and
a controller coupled to the electric motor drive and to the sensor, and including an electronic processor, the controller configured to:
  obtain the one or more measurement samples relating to electrical operation of the electric motor drive; and
  derive, based on a cost function associated with a state space model and on the one or more measurement samples, a present estimate for a parameter characterizing the electric motor; and
  determine an estimate for the parameter characterizing the electric motor by applying a filtering operation to the derived present estimate and a previous estimate for the parameter derived based on the cost function and previous one or more measurement samples, wherein to determine the estimate for the parameter by applying the filtering operation, the controller is configured to:
    apply a selective filter as the filtering operation to discard the derived present estimate for the parameter.

13. The system of claim 12, wherein to determine the estimate for the parameter, the controller is configured to:
  apply an output filter to the previous estimate for the parameter, wherein the output filter includes one or both of:
    a least-squares filtering operation, and
    a phase locked loop tracking operation.

14. A system comprising:
an electric motor drive configured to be electrically coupled to an electric motor and to provide power to the electric motor;
a sensor configured to output one or more measurement samples relating to electrical operation of the electric motor drive; and
a controller coupled to the electric motor drive and to the sensor, and including an electronic processor, the controller configured to:
  obtain the one or more measurement samples relating to electrical operation of the electric motor drive; and
  derive, based on a cost function associated with a state space model and on the one or more measurement samples, a present estimate for a parameter characterizing the electric motor, wherein the parameter is motor speed; and
  determine an estimate for the parameter characterizing the electric motor by applying a filtering operation to the derived present estimate and a previous estimate for the parameter derived based on the cost function and previous one or more measurement samples,
  derive, based on the cost function associated with the state space model and on the one or more measurement samples, a second present estimate for motor position; and
  determine a second estimate for the motor position by applying the filtering operation to the derived second present estimate and a previous second estimate for the motor position derived based on the cost function and the previous one or more measurement samples,
  wherein to determine the estimate for the motor speed and the second estimate for the motor position, the controller is configured to:
    apply an output filter that includes a dual phase locked loop tracking operation including a speed estimation phase locked loop and a position estimation phase locked loop.

* * * * *